(12) United States Patent
Hardin et al.

(10) Patent No.: US 9,009,954 B2
(45) Date of Patent: Apr. 21, 2015

(54) PROCESS FOR MANUFACTURING A Z-DIRECTED COMPONENT FOR A PRINTED CIRCUIT BOARD USING A SACRIFICIAL CONSTRAINING MATERIAL

(75) Inventors: Keith Bryan Hardin, Lexington, KY (US); Paul Kevin Hall, Lexington, KY (US); Zachary Charles Nathan Kratzer, Lexington, KY (US); Qing Zhang, Lexington, KY (US)

(73) Assignee: Lexmark International, Inc., Lexington, KY (US)

( * ) Notice: Subject to any disclaimer, the term of this patent is extended or adjusted under 35 U.S.C. 154(b) by 157 days.

(21) Appl. No.: 13/528,097

(22) Filed: Jun. 20, 2012

(65) Prior Publication Data

US 2013/0340244 A1 Dec. 26, 2013

(51) Int. Cl.
| | |
|---|---|
| *H01R 43/00* | (2006.01) |
| *H05K 1/18* | (2006.01) |
| *H01G 4/33* | (2006.01) |
| *H01G 4/35* | (2006.01) |
| *H05K 1/02* | (2006.01) |
| *H05K 3/40* | (2006.01) |

(52) U.S. Cl.
CPC ............... *H05K 1/0298* (2013.01); *H01G 4/33* (2013.01); *H01G 4/35* (2013.01); *H05K 1/0251* (2013.01); *H05K 1/184* (2013.01); *H05K 3/4046* (2013.01); *H05K 2201/09645* (2013.01); *H05K 2201/10053* (2013.01); *H05K 2201/10984* (2013.01); *Y10T 29/49002* (2015.01)

(58) Field of Classification Search
CPC ........ H01L 24/03; H01L 24/11; H05K 3/429; H05K 2201/09845; H05K 2203/1469; H05K 1/184

USPC .............. 29/825, 592.1, 602.1, 605–607, 29/830–832, 845, 846; 336/178, 200, 223, 336/232
See application file for complete search history.

(56) References Cited

U.S. PATENT DOCUMENTS

| | | | |
|---|---|---|---|
| 2,005,582 | A | 3/1934 | Given |
| 2,188,667 | A | 1/1940 | Ehlers et al. |
| 3,142,783 | A | 7/1964 | Warren |
| 3,148,356 | A | 9/1964 | Hedden, Jr. |
| 3,219,886 | A | 11/1965 | Katzin et al. |

(Continued)

FOREIGN PATENT DOCUMENTS

| | | |
|---|---|---|
| EP | 202822 A2 | 11/1986 |
| GB | 1524388 A | 9/1978 |

(Continued)

OTHER PUBLICATIONS

Prosecution history of copending U.S. Appl. No. 13/222,748 including Non-Final Office Action dated Jul. 18, 2013.

(Continued)

*Primary Examiner* — Thiem Phan
(74) *Attorney, Agent, or Firm* — Justin M Tromp

(57) ABSTRACT

A method for manufacturing a Z-directed component for insertion into a mounting hole in a printed circuit board according to one example embodiment includes forming the Z-directed component in a cavity formed by a constraining material that defines the outer shape of the Z-directed component. The constraining material is dissipated to release the Z-directed component from the constraining material and the Z-directed component is fired.

21 Claims, 19 Drawing Sheets

(56) References Cited

U.S. PATENT DOCUMENTS

| | | | |
|---|---|---|---|
| 3,262,033 A | 7/1966 | Culbertson | |
| 3,377,611 A | 4/1968 | Pawl et al. | |
| 3,545,079 A | 12/1970 | Kossar | |
| 3,652,971 A | 3/1972 | Bugg | |
| 3,666,160 A | 5/1972 | Gwyn, Jr. | |
| 3,691,326 A | 9/1972 | Grossman et al. | |
| 3,798,394 A | 3/1974 | Stokes | |
| 3,923,359 A | 12/1975 | Newsam | |
| 3,996,440 A | 12/1976 | Niconienko | |
| 4,109,295 A | 8/1978 | Rostek et al. | |
| 4,109,296 A | 8/1978 | Rostek et al. | |
| 4,147,579 A | 4/1979 | Schade | |
| 4,199,209 A | 4/1980 | Cherian et al. | |
| 4,356,230 A | 10/1982 | Emanuel et al. | |
| 4,381,134 A | 4/1983 | Anselmo et al. | |
| 4,446,505 A | 5/1984 | Long et al. | |
| 4,532,152 A | 7/1985 | Elarde | |
| 4,543,715 A | 10/1985 | Iadarola et al. | |
| 4,561,486 A | 12/1985 | Maeda et al. | |
| 4,642,588 A | 2/1987 | Kameya | |
| 4,654,472 A | 3/1987 | Goldfarb | |
| 4,654,749 A | 3/1987 | Kanai | |
| 4,675,625 A | 6/1987 | Johnston | |
| 4,700,155 A | 10/1987 | Sakamoto et al. | |
| 4,711,015 A | 12/1987 | Tega et al. | |
| 4,735,753 A | 4/1988 | Ackerman | |
| 4,775,326 A | 10/1988 | Lenaerts et al. | |
| 4,789,346 A | 12/1988 | Frantz | |
| 4,850,892 A | 7/1989 | Clayton et al. | |
| 4,913,863 A | 4/1990 | Burrafato | |
| 5,010,945 A | 4/1991 | Burke | |
| 5,147,985 A | 9/1992 | DuBrucq | |
| 5,166,096 A | 11/1992 | Cote et al. | |
| 5,167,513 A | 12/1992 | Johnson et al. | |
| 5,344,343 A | 9/1994 | Seidler | |
| 5,406,444 A | 4/1995 | Selfried et al. | |
| 5,528,080 A | 6/1996 | Goldstein | |
| 5,603,847 A | 2/1997 | Howard et al. | |
| 5,650,759 A | 7/1997 | Hittman et al. | |
| 5,669,789 A | 9/1997 | Law | |
| 5,708,569 A | 1/1998 | Howard et al. | |
| 5,760,336 A | 6/1998 | Wang | |
| 5,783,026 A | 7/1998 | Natarajan et al. | |
| 5,851,865 A | 12/1998 | Koike | |
| 5,858,145 A | 1/1999 | Sreeram et al. | |
| 5,870,921 A | 2/1999 | Piccinin et al. | |
| 5,952,723 A | 9/1999 | Takeyasu et al. | |
| 6,045,615 A | 4/2000 | Buechele et al. | |
| 6,054,649 A | 4/2000 | Uchida et al. | |
| 6,068,782 A | 5/2000 | Brandt et al. | |
| 6,153,290 A | 11/2000 | Sunahara | |
| 6,165,864 A | 12/2000 | Shen et al. | |
| 6,206,718 B1 | 3/2001 | Takahashi et al. | |
| 6,319,018 B1 | 11/2001 | Daoud | |
| 6,329,715 B1 | 12/2001 | Hayashi | |
| 6,388,208 B1 | 5/2002 | Kiani et al. | |
| 6,581,276 B2 | 6/2003 | Chung | |
| 6,593,535 B2 | 7/2003 | Gailus | |
| 6,735,855 B2 | 5/2004 | Akram et al. | |
| 6,747,217 B1 | 6/2004 | Jochym et al. | |
| 6,754,551 B1 | 6/2004 | Zohar et al. | |
| 6,870,252 B2 | 3/2005 | Novak et al. | |
| 6,920,673 B2 | 7/2005 | Allen et al. | |
| 6,948,943 B2 | 9/2005 | Li | |
| 6,950,066 B2 | 9/2005 | Hendler et al. | |
| 6,983,535 B2 | 1/2006 | Crockett et al. | |
| 7,101,730 B2 | 9/2006 | Bolken et al. | |
| 7,238,892 B2 | 7/2007 | Bois et al. | |
| 7,416,985 B2 | 8/2008 | Yamamoto et al. | |
| 7,458,151 B2 | 12/2008 | Onodera et al. | |
| 7,486,498 B2 | 2/2009 | Welsch et al. | |
| 7,509,856 B1 | 3/2009 | Winkens et al. | |
| 7,525,814 B2 | 4/2009 | Yuri et al. | |
| 7,599,191 B2 | 10/2009 | Shinaberger et al. | |
| 7,652,364 B2 | 1/2010 | Knighten et al. | |
| 7,663,064 B2 | 2/2010 | Dutta et al. | |
| 7,791,203 B2 | 9/2010 | Boon et al. | |
| 7,820,479 B2 | 10/2010 | Sakaguchi | |
| 7,843,056 B2 | 11/2010 | Smeys et al. | |
| 7,845,073 B2 * | 12/2010 | Lee et al. | 29/846 |
| 7,888,599 B2 | 2/2011 | Kim et al. | |
| 7,891,980 B2 | 2/2011 | Frasco | |
| 7,969,745 B2 | 6/2011 | Hsu et al. | |
| 8,000,763 B2 | 8/2011 | Mazza et al. | |
| 8,035,951 B2 | 10/2011 | Wu et al. | |
| 8,094,429 B2 | 1/2012 | Hsu et al. | |
| 8,115,113 B2 | 2/2012 | Tanaka | |
| 8,198,547 B2 | 6/2012 | Hardin et al. | |
| 8,198,548 B2 | 6/2012 | Hardin et al. | |
| 8,237,061 B2 | 8/2012 | Hardin et al. | |
| 8,549,731 B2 * | 10/2013 | Lim et al. | 29/605 |
| 2001/0012036 A1 | 8/2001 | Giere et al. | |
| 2001/0051388 A1 | 12/2001 | Shiozaki et al. | |
| 2002/0086188 A1 | 7/2002 | Halsey et al. | |
| 2002/0117330 A1 | 8/2002 | Eldridge et al. | |
| 2003/0081370 A1 | 5/2003 | Haskell et al. | |
| 2003/0101585 A1 | 6/2003 | Pearson et al. | |
| 2004/0121266 A1 | 6/2004 | Lee et al. | |
| 2004/0224558 A1 | 11/2004 | Wan et al. | |
| 2004/0242082 A1 | 12/2004 | Tsuchiya | |
| 2005/0112831 A1 | 5/2005 | Surdeanu | |
| 2005/0128680 A1 | 6/2005 | Shin et al. | |
| 2005/0156319 A1 | 7/2005 | Oggioni et al. | |
| 2005/0286238 A1 | 12/2005 | Joy | |
| 2006/0009038 A1 | 1/2006 | Cohen et al. | |
| 2006/0046468 A1 | 3/2006 | Akram et al. | |
| 2006/0054352 A1 | 3/2006 | Ryu et al. | |
| 2006/0071795 A1 | 4/2006 | Benedikt | |
| 2006/0137907 A1 | 6/2006 | Chheda et al. | |
| 2006/0145800 A1 | 7/2006 | Dadafshar et al. | |
| 2006/0215380 A1 | 9/2006 | Lu et al. | |
| 2006/0243581 A1 | 11/2006 | Nishimoto et al. | |
| 2006/0266549 A1 | 11/2006 | Lin et al. | |
| 2006/0278072 A1 | 12/2006 | Kent et al. | |
| 2006/0286696 A1 | 12/2006 | Peiffer et al. | |
| 2007/0051594 A1 | 3/2007 | Schwarz et al. | |
| 2007/0085125 A1 | 4/2007 | Inoue et al. | |
| 2007/0099513 A1 | 5/2007 | Savage et al. | |
| 2007/0124930 A1 | 6/2007 | Cheng et al. | |
| 2007/0138646 A1 | 6/2007 | Heston et al. | |
| 2007/0257761 A1 | 11/2007 | Mano et al. | |
| 2008/0013250 A1 | 1/2008 | Aoki | |
| 2008/0047137 A1 | 2/2008 | Asahi et al. | |
| 2008/0060837 A1 | 3/2008 | Matsui | |
| 2008/0093336 A1 | 4/2008 | Lee et al. | |
| 2008/0112109 A1 | 5/2008 | Muto et al. | |
| 2008/0158770 A1 | 7/2008 | Lee et al. | |
| 2008/0158851 A1 | 7/2008 | Cochrane | |
| 2008/0169125 A1 | 7/2008 | Hsu et al. | |
| 2008/0202799 A1 | 8/2008 | Graydon et al. | |
| 2008/0223603 A1 | 9/2008 | Kim et al. | |
| 2008/0236876 A1 | 10/2008 | Kodama et al. | |
| 2008/0315024 A1 | 12/2008 | Gallagher | |
| 2008/0318410 A1 | 12/2008 | Hwang | |
| 2009/0046441 A1 | 2/2009 | Funaya et al. | |
| 2009/0097218 A1 | 4/2009 | Miyamoto | |
| 2009/0114421 A1 | 5/2009 | Swift et al. | |
| 2009/0154872 A1 | 6/2009 | Sherrer et al. | |
| 2009/0175012 A1 | 7/2009 | Frasco | |
| 2009/0212412 A1 | 8/2009 | Yoon | |
| 2009/0219667 A1 | 9/2009 | Eriksson | |
| 2010/0026440 A1 | 2/2010 | Lim et al. | |
| 2010/0059266 A1 | 3/2010 | Yoo et al. | |
| 2010/0124035 A1 | 5/2010 | Bandholz et al. | |
| 2010/0208440 A1 | 8/2010 | Peiffer et al. | |
| 2010/0230806 A1 | 9/2010 | Huang et al. | |
| 2010/0237495 A1 | 9/2010 | Pagaila et al. | |
| 2010/0326843 A1 | 12/2010 | Zhang et al. | |
| 2011/0017502 A1 | 1/2011 | Hardin et al. | |
| 2011/0017503 A1 | 1/2011 | Hardin et al. | |
| 2011/0017504 A1 | 1/2011 | Hardin et al. | |
| 2011/0017505 A1 | 1/2011 | Hardin et al. | |
| 2011/0017507 A1 | 1/2011 | Hardin et al. | |
| 2011/0017581 A1 | 1/2011 | Hardin et al. | |

(56) References Cited

U.S. PATENT DOCUMENTS

| | | | |
|---|---|---|---|
| 2011/0019374 | A1 | 1/2011 | Hardin et al. |
| 2011/0019375 | A1 | 1/2011 | Hardin et al. |
| 2011/0019376 | A1 | 1/2011 | Hardin et al. |
| 2011/0037155 | A1 | 2/2011 | Pagaila |
| 2012/0108115 | A1 | 5/2012 | Hardin et al. |
| 2012/0224296 | A1 | 9/2012 | Hardin et al. |

FOREIGN PATENT DOCUMENTS

| | | |
|---|---|---|
| JP | 2002-316084 A | 10/2002 |
| WO | 8001146 A1 | 6/1980 |
| WO | 8301923 A1 | 6/1983 |
| WO | 2006121818 A2 | 11/2006 |

OTHER PUBLICATIONS

Prosecution history of copending U.S. Appl. No. 13/222,276 including Non-Final Office Action dated Jun. 11, 2013.
International Search Report and Written Opinion of the International Searching Authority for PCT Application No. PCT/US13/34298 dated Jul. 5, 2013.
International Search Report and Written Opinion of the International Searching Authority for PCT Application No. PCT/US13/34289 dated Jul. 8, 2013.
International Search Report and Written Opinion of the International Searching Authority for PCT Application No. PCT/US13/34285 dated Jun. 28, 2013.
International Search Report and Written Opinion of the International Searching Authority for PCT Application No. PCT/US13/34281 dated Jul. 8, 2013.
International Search Report and Written Opinion of the International Searching Authority for PCT Application No. PCT/US12/52256 dated Nov. 16, 2012.
International Search Report and Written Opinion of the International Searching Authority for PCT Application No. PCT/US12/52258 dated Nov. 16, 2012.
International Search Report and Written Opinion of the International Searching Authority for PCT Application No. PCT/US12/52262 dated Jan. 10, 2013.
International Search Report and Written Opinion of the International Searching Authority for PCT Application No. PCT/US12/56840 dated Jan. 11, 2013.
International Search Report and Written Opinion of the International Searching Authority for PCT Application No. PCT/US12/61251 dated Jan. 25, 2013.
Prosecution history of copending U.S. Appl. No. 13/222,748 including Final Office Action dated Jan. 7, 2014 and Notice of Allowance dated Mar. 11, 2014.
Prosecution history of copending U.S. Appl. No. 13/250,812 including Notice of Allowance dated Feb. 3, 2014.
Albertsen et al., "Combined Manufacture Methods for High Density LTCC Substrates: Thick Film Screen Printing, Ink Jet, Postfiring Thin Film Processes, and Laser-Drilled Fine Vias," Journal of Microelectronics and Electronic Packaging vol. 6, No. 1, 1st Qtr. 2009.
International Search Report and Written Opinion of the International Searching Authority for PCT Application No. PCT/US13/46466 dated Oct. 16, 2013.
International Search Report and Written Opinion of the International Searching Authority for PCT Application No. PCT/US13/46467 dated Nov. 14, 2013.
"IPC Standards—The Evolution of Embedded Components Standards"; IPC Review Mar./Apr. 2009; p. 14; vol. 2; IPC, Inc., Bannockburn, Illinois, USA (1 page).
2010 Spectrum Advanced Specialty Products Catalog; relevant pp. AC2-AC12; Spectrum Advanced Specialty Products; Fairview, Pennsylvania, USA (21 pages).
International Searching Authority, International Search Report and Written Opinion for PCT/US2011/022005, Mar. 18, 2011 (6 pages).
International Searching Authority, International Search Report and Written Opinion for PCT/US2011/022008, Mar. 29, 2011 (6 pages).
International Searching Authority, International Search Report and Written Opinion for PCT/US2011/022012, Apr. 11, 2011 (7 pages).
International Searching Authority, International Search Report and Written Opinion for PCT/US2011/022019, Mar. 23, 2011 (8 pages).
International Searching Authority, International Search Report and Written Opinion for PCT/US2011/022021, Mar. 28, 2011 (6 pages).
International Searching Authority, International Search Report and Written Opinion for PCT/US2011/022022, Mar. 28, 2011 (6 pages).
International Searching Authority, International Search Report and Written Opinion for PCT/US2011/022027, May 2, 2011 (7 pages).
International Searching Authority, International Search Report and Written Opinion for PCT/US2011/022028, Apr. 1, 2011 (9 pages).
International Searching Authority, International Search Report and Written Opinion for PCT/US2011/022036, Apr. 1, 2011 (6 pages).
Copending U.S. Appl. No. 13/222,418, filed Aug. 31, 2011.
Copending U.S. Appl. No. 13/222,276, filed Aug. 31, 2011.
Copending U.S. Appl. No. 13/222,748, filed Aug. 31, 2011.
Copending U.S. Appl. No. 13/250,812, filed Sep. 30, 2011.
Copending U.S. Appl. No. 13/284,084, filed Oct. 28, 2011.
Copending U.S. Appl. No. 13/433,349, filed Mar. 29, 2012.
Copending U.S. Appl. No. 13/433,355, filed Mar. 29, 2012.
Copending U.S. Appl. No. 13/433,364, filed Mar. 29, 2012.
Copending U.S. Appl. No. 13/433,369, filed Mar. 29, 2012.
Copending U.S. Appl. No. 13/433,340, filed Mar. 29, 2012.
Copending U.S. Appl. No. 13/528,129, filed Jun. 20, 2012.
Prosecution history of copending U.S. Appl. No. 13/284,084 including Final Office Action dated May 8, 2014.
U.S. Appl. No. 14/268,265, filed May 2, 2014.
Written Opinion of the Intellectual Property Office of Singapore dated Jun. 20, 2014, mailed Jul. 15, 2014 for Singapore Patent Application No. 11201400183P which claims priority to U.S. Appl. No. 13/284,084.
Written Opinion of the Intellectual Property Office of Singapore dated Aug. 16, 2014, mailed Sep. 3, 2014 for Singapore Patent Application No. 11201400177X which claims priority to U.S. Appl. No. 13/222,418.
U.S. Appl. No. 14/574,903, filed Dec. 18, 2014.
Prosecution history of copending U.S. Appl. No. 13/222,418 including Non-Final Office Action dated Nov. 20, 2014.
Prosecution history of copending U.S. Appl. No. 13/528,129 including Non-Final Office Action dated Nov. 28, 2014.

* cited by examiner

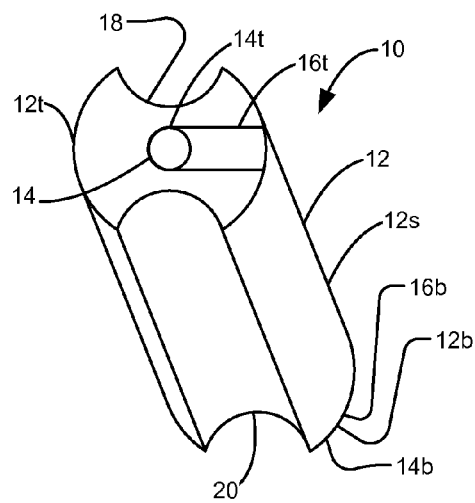
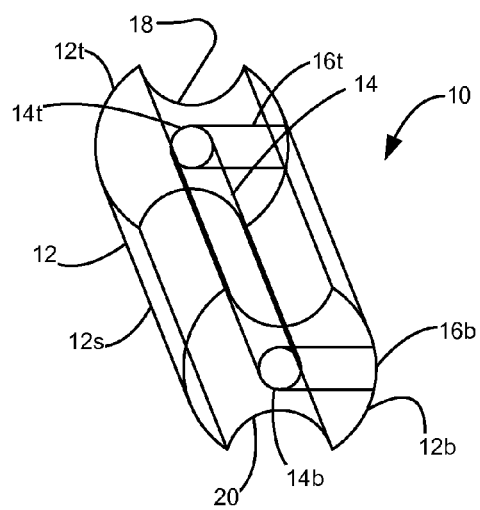
Figure 1    Figure 2
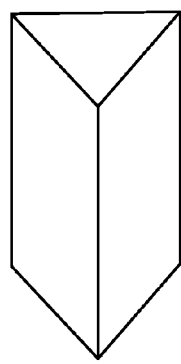
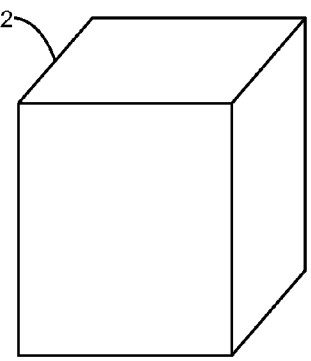
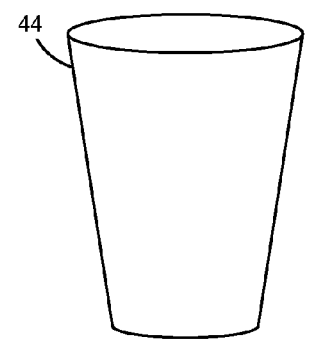
Figure 3A    Figure 3B    Figure 3C
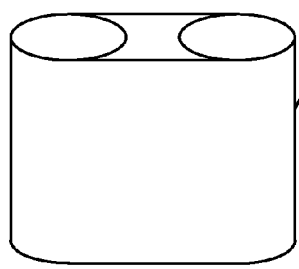
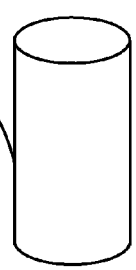
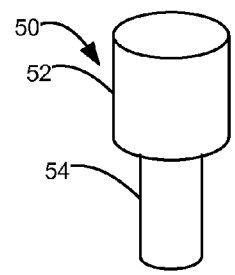
Figure 3D    Figure 3E    Figure 3F

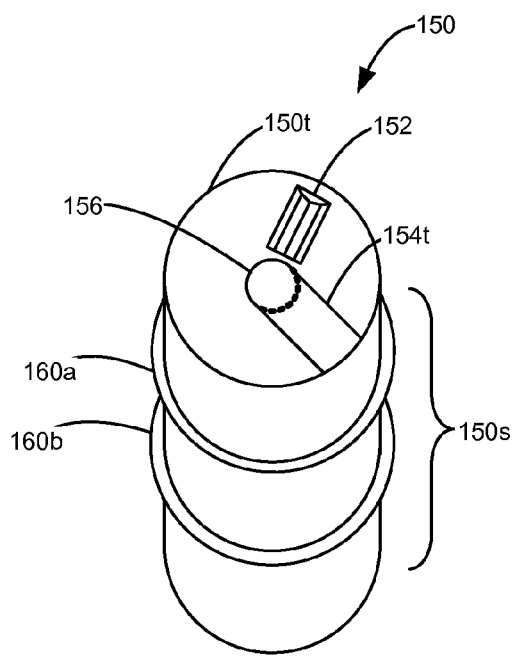
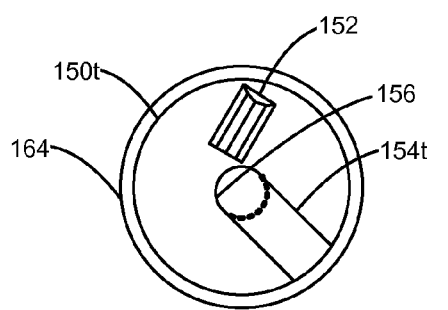
Figure 6B
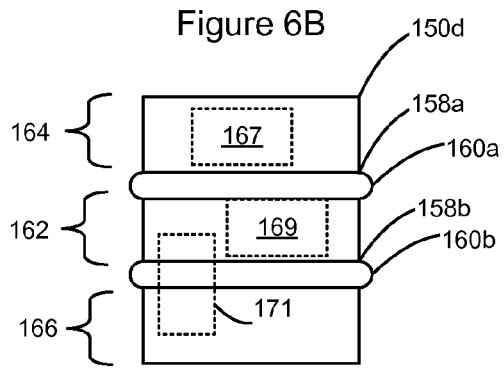
Figure 6A
Figure 6C
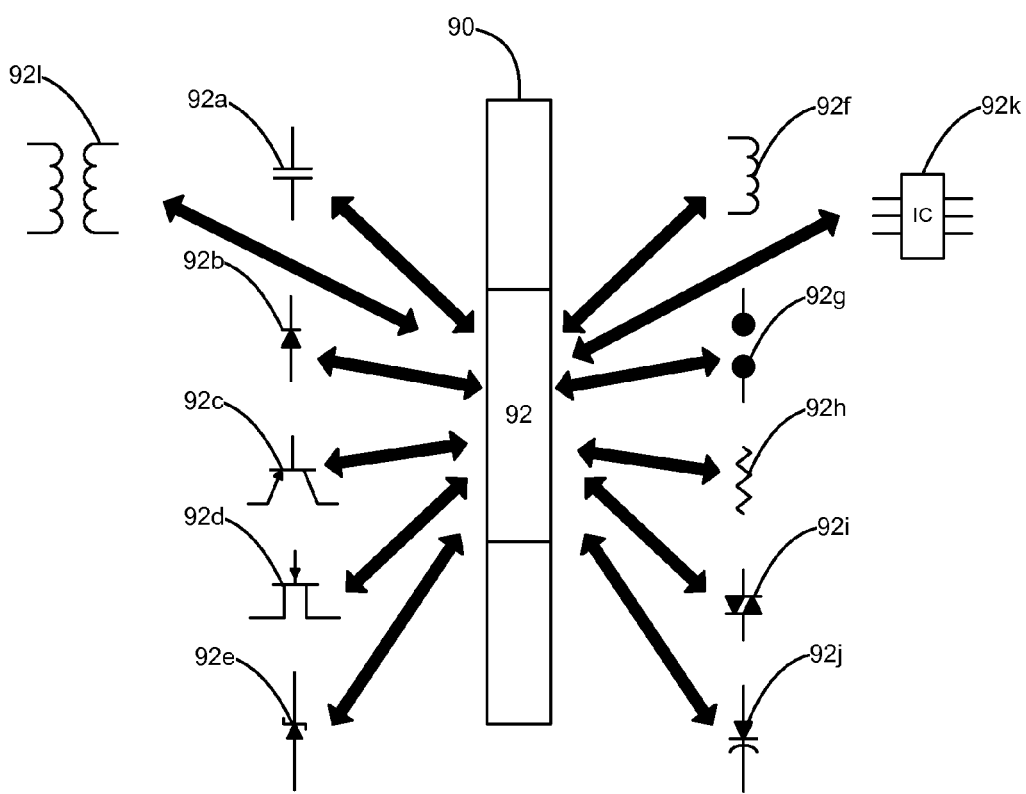
Figure 7

PROCESS FOR MANUFACTURING A Z-DIRECTED COMPONENT FOR A PRINTED CIRCUIT BOARD USING A SACRIFICIAL CONSTRAINING MATERIAL

CROSS REFERENCES TO RELATED APPLICATIONS

This patent application is related to U.S. patent application Ser. No. 13/528,129, filed Jun. 20, 2012, entitled "Z-Directed Printed Circuit Board Components Having a Removable End Portion and Method Therefor," U.S. patent application Ser. No. 13/222,748, filed Aug. 31, 2011, entitled "Die Press Process for Manufacturing a Z-Directed Component for a Printed Circuit Board," U.S. patent application Ser. No. 13/222,418, filed Aug. 31, 2011, entitled "Screening Process for Manufacturing a Z-Directed Component for a Printed Circuit Board," U.S. patent application Ser. No. 13/222,276, filed Aug. 31, 2011, entitled "Spin Coat Process for Manufacturing a Z-Directed Component for a Printed Circuit Board," U.S. patent application Ser. No. 13/250,812, filed Sep. 30, 2011, entitled "Extrusion Process for Manufacturing a Z-Directed Component for a Printed Circuit Board" and U.S. patent application Ser. No. 13/284,084, filed Oct. 28, 2011, entitled "Continuous Extrusion Process for Manufacturing a Z-Directed Component for a Printed Circuit Board," which are assigned to the assignee of the present application.

BACKGROUND

1. Field of the Disclosure

The present invention relates generally to processes for manufacturing printed circuit board components and more particularly to a sacrificial constraining process for manufacturing a Z-directed component for a printed circuit board.

2. Description of the Related Art

The following United States patent applications, which are assigned to the assignee of the present application, describe various "Z-directed" components that are intended to be embedded or inserted into a printed circuit board ("PCB"): Ser. No. 12/508,131 entitled "Z-Directed Components for Printed Circuit Boards," Ser. No. 12/508,145 entitled "Z-Directed Pass-Through Components for Printed Circuit Boards," Ser. No. 12/508,158 entitled "Z-Directed Capacitor Components for Printed Circuit Boards," Ser. No. 12/508,188 entitled "Z-Directed Delay Line Components for Printed Circuit Boards," Ser. No. 12/508,199 entitled "Z-Directed Filter Components for Printed Circuit Boards," Ser. No. 12/508,204 entitled "Z-Directed Ferrite Bead Components for Printed Circuit Boards," Ser. No. 12/508,215 entitled "Z-Directed Switch Components for Printed Circuit Boards," Ser. No. 12/508,236 entitled "Z-Directed Connector Components for Printed Circuit Boards," and Ser. No. 12/508,248 entitled "Z-Directed Variable Value Components for Printed Circuit Boards."

As densities of components for printed circuit boards have increased and higher frequencies of operation are used, some circuits' designs have become very difficult to achieve. The Z-directed components described in the foregoing patent applications are designed to improve the component densities and frequencies of operation. The Z-directed components occupy less space on the surface of a PCB and for high frequency circuits, e.g. clock rates greater than 1 GHz, allow for higher frequency of operation. The foregoing patent applications describe various types of Z-directed components including, but not limited to, capacitors, delay lines, transistors, switches, and connectors. A process that permits mass production of these components on a commercial scale is desired.

SUMMARY

A method for manufacturing a Z-directed component for insertion into a mounting hole in a printed circuit board according to a first example embodiment includes forming the Z-directed component in a cavity formed by a constraining material that defines the outer shape of the Z-directed component. The constraining material is dissipated to release the Z-directed component from the constraining material and the Z-directed component is fired.

A method for manufacturing a Z-directed component for insertion into a mounting hole in a printed circuit board according to a second example embodiment includes providing successive layers of a constraining material, each layer of the constraining material having a cavity formed therein defining the outer shape of a corresponding layer of the Z-directed component. Each cavity is selectively filled with at least one material to form each layer of the Z-directed component. Each cavity is selectively filled prior to providing the next successive layer of the constraining material. The constraining material is dissipated to release the Z-directed component from the constraining material and the Z-directed component is fired.

A method for manufacturing a Z-directed component for insertion into a mounting hole in a printed circuit board according to a third example embodiment includes providing a first layer of a constraining material having a first cavity formed therein defining the outer shape of a first layer of the Z-directed component. The first cavity is selectively filled with at least one material to form a first layer of the Z-directed component. The first layer of the Z-directed component is combined with additional layers to form the Z-directed component. The constraining material is dissipated to release the Z-directed component from the constraining material and the Z-directed component is fired.

BRIEF DESCRIPTION OF THE DRAWINGS

The above-mentioned and other features and advantages of the various embodiments, and the manner of attaining them, will become more apparent and will be better understood by reference to the accompanying drawings.

FIG. 1 is a perspective view of a Z-directed component according to one example embodiment.

FIG. 2 is a transparent perspective view of the Z-directed component shown in FIG. 1 illustrating the internal arrangement of elements of the Z-directed component.

FIGS. 3A-3F are perspective views showing various example shapes for the body of a Z-directed component.

FIG. 6A is a perspective view of a Z-directed component having O-rings for connecting to internal layers of a PCB and having a body having regions comprised of similar and/or dissimilar materials according to one example embodiment.

FIG. 6B is a top plan view of the Z-directed component shown in FIG. 6A.

FIG. 6C is a schematic side elevation view of the Z-directed component shown in FIG. 6A.

FIG. 7 is a schematic illustration of various example elements or electronic components that may be provided within the body of a Z-directed component in series with a conductive channel.

FIG. 16 is a perspective view of an example screen for applying conductive material to the substrate material.

FIG. 17 is a perspective view of the substrate material having conductive applied thereon through the example screen shown in FIG. 16.

FIG. 18 is a perspective view showing a first layer of sacrificial constraining material applied to the substrate material according to one example embodiment.

FIG. 19 is a perspective view showing a cavity in the first layer of sacrificial constraining material filled with photoresist material according to one example embodiment.

FIG. 20 is a perspective view showing the photoresist material removed after the application of conductive material according to one example embodiment.

FIG. 21 is a perspective view showing body material applied to the first layer of sacrificial constraining material according to one example embodiment.

FIG. 22 is a perspective view showing additional conductive material applied to form a conductive plate for a Z-directed capacitor according to one example embodiment.

FIG. 23 is a perspective view showing a second layer of sacrificial constraining material applied to form a second layer of the component according to one example embodiment.

FIG. 24 is a perspective view showing conductive material applied to the substrate material according to one example embodiment.

FIG. 25 is a perspective view showing a first layer of the Z-directed component formed in the sacrificial constraining material according to one example embodiment.

FIG. 26 is a perspective view showing two sets of vertical conductive plates formed according to one example embodiment.

FIG. 27 is a perspective view showing the body material applied according to one example embodiment.

DETAILED DESCRIPTION

Figures 4A, 4B, 4C:
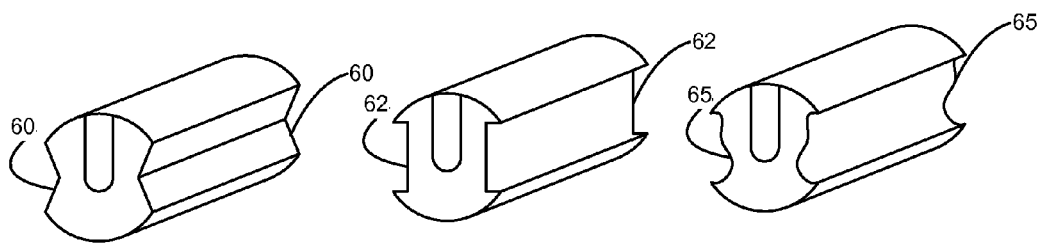
FIGS. 4A-4C are perspective views showing various example side channel configurations for a Z-directed component.

The following description and drawings illustrate embodiments sufficiently to enable those skilled in the art to practice the present invention. It is to be understood that the disclosure is not limited to the details of construction and the arrangement of components set forth in the following description or illustrated in the drawings. The invention is capable of other embodiments and of being practiced or of being carried out in various ways. For example, other embodiments may incorporate structural, chronological, electrical, process, and other changes. Examples merely typify possible variations. Individual components and functions are optional unless explicitly required, and the sequence of operations may vary. Portions and features of some embodiments may be included in or substituted for those of others. The scope of the application encompasses the appended claims and all available equivalents. The following description is, therefore, not to be taken in a limited sense and the scope of the present invention is defined by the appended claims.

Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings. In addition, the terms "connected" and "coupled" and variations thereof are not restricted to physical or mechanical connections or couplings.

Overview of Z-Directed Components

An X-Y-Z frame of reference is used herein. The X and Y axes describe the plane defined by the face of a printed circuit board. The Z-axis describes a direction perpendicular to the plane of the circuit board. The top surface of the PCB has a zero Z-value. A component with a negative Z-direction value indicates that the component is inserted into the top surface of the PCB. Such a component may be above (extend past), flush with, or recessed below either the top surface and/or the bottom surface of the PCB. A component having both a positive and negative Z-direction value indicates that the component is partially inserted into the surface of the PCB. The Z-directed components are intended to be inserted into a hole or recess in a printed circuit board. Depending on the shape and length of the component(s), more than one Z-directed component may be inserted into a single mounting hole in the PCB, such as being stacked together or positioned side by side. The hole may be a through hole (a hole from the top surface through to the bottom surface), a blind hole (an opening or recess through either the top or bottom surface into an interior portion or internal layer of the PCB) or an internal cavity such that the Z-directed component is embedded within the PCB.

For a PCB having conductive traces on both external layers, one external layer is termed the top surface and the other the bottom surface. Where only one external layer has conductive traces, that external surface is referred to as the top surface. The Z-directed component is referred to as having a top surface, a bottom surface and a side surface. The references to top and bottom surfaces of the Z-directed component conform to the convention used to refer to the top and bottom surfaces of the PCB. The side surface of a Z-directed component extends between the top and bottom surfaces of the PCB and would be adjacent to the wall of the mounting hole in the PCB where the mounting hole is perpendicular to the face of the PCB. This use of top, bottom and side should not be taken as limiting how a Z-directed component may be mounted into a PCB. Although the components are described herein as being mounted in a Z-direction, this does not mean that such components are limited to being inserted into a PCB only along the Z-axis. Z-directed components may be mounted normal to the plane of the PCB from the top or bottom surfaces or both surfaces, mounted at an angle thereto or, depending on the thickness of the PCB and the dimensions of the Z-directed component, inserted into the edge of the PCB between the top and bottom surfaces of the PCB. Further, the Z-directed components may be inserted into the edge of the PCB even if the Z-directed component is wider than the PCB is tall as long as the Z-directed component is held in place.

The Z-directed components may be made from various combinations of materials commonly used in electronic components. The signal connection paths are made from conductors, which are materials that have high conductivity. Unless otherwise stated, reference to conductivity herein refers to electrical conductivity. Conducting materials include, but are not limited to, copper, gold, aluminum, silver, tin, lead and many others. The Z-directed components may have areas that need to be insulated from other areas by using insulator materials that have low conductivity like plastic, glass, FR4 (epoxy & fiberglass), air, mica, ceramic and others. Capacitors are typically made of two conducting plates separated by an insulator material that has a high permittivity (dielectric constant). Permittivity is a parameter that shows the ability to store electric fields in the materials like ceramic, mica, tantalum and others. A Z-directed component that is constructed as a resistor requires materials that have properties that are between a conductor and insulator having a finite amount of resistivity, which is the reciprocal of conductivity. Materials like carbon, doped semiconductor, nichrome, tin-oxide and others are used for their resistive properties. Inductors are typically made of coils of wires or conductors wrapped around a material with high permeability. Permeability is a parameter that shows the ability to store magnetic fields in the material which may include iron and alloys like nickel-zinc, manganese-zinc, nickel-iron and others. Transistors such as field effect transistors ("FETs") are electronic devices that are made from semiconductors that behave in a nonlinear fashion and are made from silicon, germanium, gallium arsenide and others.

Throughout the application there are references that discuss different materials, properties of materials or terminology interchangeably as currently used in the art of material science and electrical component design. Because of the flexibility in how a Z-directed component may be employed and the number of materials that may be used, it is also contemplated that Z-directed components may be constructed of materials that have not been discovered or created to date. The body of a Z-directed component will in general be comprised of an insulator material unless otherwise called out in the description for a particular design of a Z-directed component. This material may possess a desired permittivity, e.g., the body of a capacitor will typically be comprised of an insulator material having a relatively high dielectric constant.

PCBs using a Z-directed component may be constructed to have a single conductive layer or multiple conductive layers as is known. The PCB may have conductive traces on the top surface only, on the bottom surface only, or on both the top and bottom surfaces. In addition, one or more intermediate internal conductive trace layers may also be present in the PCB.

Connections between a Z-directed component and the traces in or on a PCB may be accomplished by soldering techniques, screening techniques, extruding techniques or plating techniques known in the art. Depending on the application, solder pastes and conductive adhesives may be used. In some configurations, compressive conductive members may be used to interconnect a Z-directed component to conductive traces found on the PCB.

The most general form of a Z-directed component comprises a body having a top surface, a bottom surface and a side surface, a cross-sectional shape that is insertable into a mounting hole of a given depth D within a PCB with a portion of the body comprising an insulator material. All of the embodiments described herein for Z-directed components are based on this general form.

FIGS. 1 and 2 show an embodiment of a Z-directed component. In this embodiment, Z-directed component 10 includes a generally cylindrical body 12 having a top surface 12t, a bottom surface 12b, a side surface 12s, and a length L generally corresponding to the depth D of the mounting hole. The length L can be less than, equal to or greater than the depth D. In the former two cases, Z-directed component 10 would in one case be below at least one of the top and bottom surfaces of the PCB and in the other it may be flush with the two surfaces of the PCB. Where length L is greater than depth D, Z-directed component 10 would not be flush mounted with at least one of the top and bottom surfaces of the PCB. However, with this non-flush mount, Z-directed component 10 would be capable of being used to interconnect to another component or another PCB that is positioned nearby. The mounting hole is typically a through-hole extending between the top and bottom surfaces of the PCB but it may also be a blind hole. When recessed below the surface of the PCB, additional resist areas may be required in the hole of the PCB to keep from plating the entire circumferential area around the hole.

Z-directed component 10 in one form may have at least one conductive channel 14 extending through the length of body 12. At the top and bottom ends 14t and 14b of conductive channel 14, top and bottom conductive traces 16t, 16b are provided on the top and bottom end surfaces 12t, 12b of body 12 and extend from respective ends of the conductive channel 14 to the edge of Z-directed component 10. In this embodiment, body 12 comprises an insulator material. Depending on its function, body 12 of Z-directed component 10 may be made of variety of materials having different properties. These properties include being conductive, resistive, magnetic, dielectric, or semi-conductive or various combinations of properties as described herein. Examples of materials that have the properties are copper, carbon, iron, ceramic or silicon, respectively. Body 12 of Z-directed component 10 may also comprise a number of different networks needed to operate a circuit that will be discussed later.

One or more longitudinally extending channels or wells may be provided on the side surface of body 12 of Z-directed component 10. The channel may extend from one of the top surface and the bottom surface of body 12 toward the opposite surface. As illustrated, two concave side wells or channels 18 and 20 are provided in the outer surface of Z-directed component 10 extending the length of body 12. When plated or soldered, these channels allow electrical connections to be made to Z-directed component 10, through the PCB, as well as to internal conductive layers within the PCB. The length of side channels 18 or 20 may extend less than the entire length of body 12.

FIG. 2 shows the same component as in FIG. 1 but with all the surfaces transparent. Conductive channel 14 is shown as a cylinder extending through the center of Z-directed component 10. Other shapes may also be used for conductive channel 14. Traces 16t and 16b can be seen extending from ends 14t and 14b of conductive channel 14, respectively, to the edge of body 12. While traces 16t and 16b are shown as being in alignment with one another (zero degrees apart), this is not a requirement and they may be positioned as needed for a particular design. For example, traces 16t and 16b may be 180 degrees apart or 90 degrees apart or any other increment.

The shape of the body of the Z-directed component may be any shape that can fit into a mounting hole in a PCB. FIGS. 3A-3F illustrate possible body shapes for a Z-directed component. FIG. 3A shows a triangular cross-sectional body 40; FIG. 3B shows a rectangular cross-sectional body 42; FIG. 3C shows a frusto-conical body 44; FIG. 3D shows an ovate cross-sectional cylindrical body 46; and FIG. 3E shows a cylindrical body 48. FIG. 3F shows a stepped cylindrical body 50 where one portion 52 has a larger diameter than another portion 54. With this arrangement, the Z-directed component may be mounted on the surface of the PCB while having a section inserted into a mounting hole provided in the PCB. The edges of the Z-directed component may be beveled to help with aligning the Z-directed component for insertion into a mounting hole in a PCB. Other shapes and combinations of those illustrated may also be used for a Z-directed component as desired.

For a Z-directed component, the channels for plating can be of various cross-sectional shapes and lengths. The only requirement is that plating or solder material make the proper connections to the Z-directed component and corresponding conductive traces in or on the PCB. Side channels 18 or 20 may have, for example, V-, C- or U-shaped cross-sections, semi-circular or elliptical cross-sections. Where more than one channel is provided, each channel may have the same or a different cross-sectional shape. FIGS. 4A-4C illustrate three side channel shapes. In FIG. 4A, V-shaped side channels 60 are shown. In FIG. 4B, U- or C-shaped side channels 62 are shown. In FIG. 4C, wavy or irregular cross-sectional side channel shapes 65 are shown.

The numbers of layers in a PCB varies from being single sided to being over 22 layers and may have different overall thicknesses that range from less than 0.051 inch to over 0.093 inch or more. Where a flush mount is desired, the length of the Z-directed component will depend on the thickness of the PCB into which it is intended to be inserted. The Z-directed component's length may also vary depending on the intended function and tolerance of a process. The preferred lengths will be where the Z-directed component is either flush with the surfaces or extends slightly beyond the surface of the PCB. This would keep the plating solution from plating completely around the interior of the PCB hole that may cause a short in some cases. It is possible to add a resist material around the interior of a PCB hole to only allow plating in the desired areas. However, there are some cases where it is desired to completely plate around the interior of a PCB hole above and below the Z-directed component. For example, if the top layer of the PCB is a $V_{CC}$ plane and the bottom layer is a GND plane then a decoupling capacitor would have lower impedance if the connection used a greater volume of copper to make the connection.

There are a number of features that can be added to a Z-directed component to create different mechanical and electrical characteristics. The number of channels or conductors can be varied from zero to any number that can maintain enough strength to take the stresses of insertion, plating, manufacturing processes and operation of the PCB in its intended environment. The outer surface of a Z-directed component may have a coating that glues it in place. Flanges or radial projections may also be used to prevent over or under insertion of a Z-directed component into the mounting hole, particularly where the mounting hole is a through-hole. A surface coating material may also be used to promote or impede migration of the plating or solder material. Various locating or orienting features may be provided such as a recess or projection, or a visual or magnetic indicator on an end surface of the Z-directed component. Further, a connecting feature such as a conductive pad, a spring loaded style pogo-pin or even a simple spring may be included to add an additional electrical connection (such as frame ground) point to a PCB.

Figures 5A, 5B, 5C, 5D:
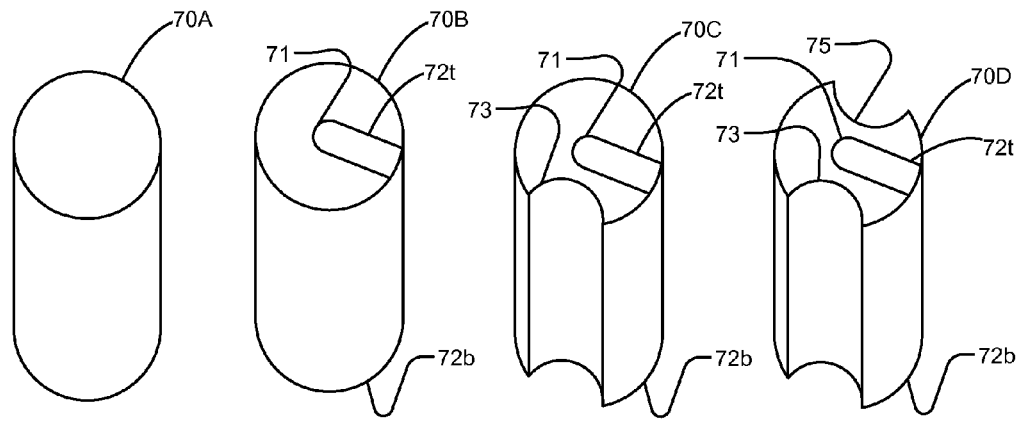
FIGS. 5A-5H are perspective views showing various example channel configurations for the body of a Z-directed component.
Figures 5E, 5F, 5G, 5H:
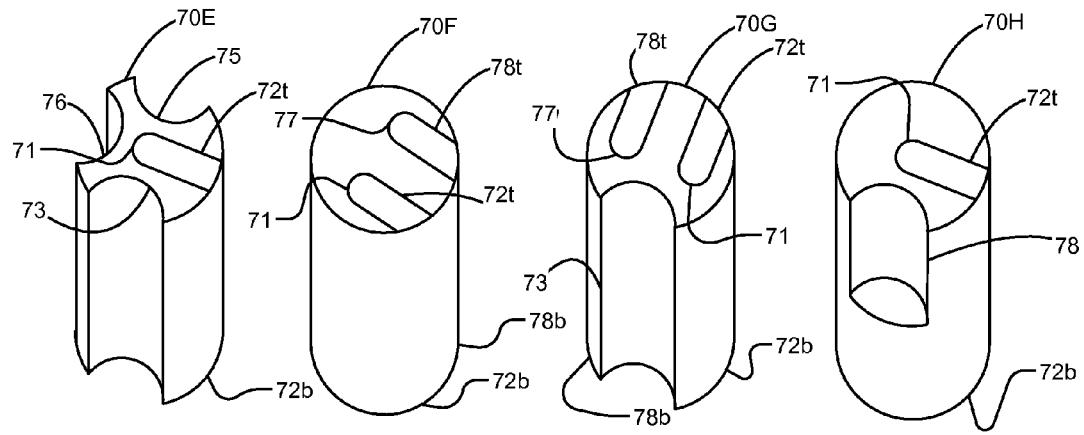

A Z-directed component may take on several roles depending on the number of ports or terminals needed to make connections to the PCB. Some possibilities are shown in FIGS. 5A-H. FIG. 5A is a Z-directed component configured as 0-port device 70A used as a plug so that if a filter or a component is optional then the plug stops the hole from being plated. After the PCB has been manufactured, the 0-port device 70A may be removed and another Z-directed component may be inserted, plated and connected to the circuit. FIGS. 5B-5H illustrate various configurations useful for multi-terminal devices such as resistors, diodes, transistors, and/or clock circuits. FIG. 5B shows a 1-port or single signal Z-directed component 70B having a conductive channel 71 through a center portion of the component connected to top and bottom conductive traces 72t, 72b. FIG. 5C shows a 1-port 1-channel Z-directed component 70C where one plated side well or channel 73 is provided in addition to conductive channel 71 through the component, which is connected to top and bottom conductive traces 72t and 72b. FIG. 5D shows a Z-directed component 70D having two side wells 73 and 75 in addition to conductive channel 71 through the component which is connected to top and bottom traces 72t, 72b. The Z-directed component 70E of FIG. 5E has three side wells 73, 75 and 76 in addition to conductive channel 71 through the component, which is connected to top and bottom traces 72t, 72b. FIG. 5F shows Z-directed component 70F having two conductive channels 71 and 77 through the component each with their respective top and bottom traces 72t, 72b and 78t, 78b and no side channels or wells. Z-directed component 70F is a two signal device to be primarily used for differential signaling. FIG. 5G shows a Z-directed component 70G having one side well 73 and two conductive channels 71 and 77 each with their respective top and bottom traces 72t, 72b and 78t, 78b. FIG. 5H shows Z-directed component 70H having one conductive channel 71 with top and bottom traces 72t, 72b and a blind well or partial well 78 extending from the top surface along a portion of the side surface that will allow the plating material or solder to stop at a given depth. For one skilled in the art, the number of wells and signals is only limited by the space, required well or channel sizes.

FIGS. 6A-C illustrate another configuration for a Z-directed component utilizing O-rings for use in a PCB having a top and bottom conductive layer and at least one internal conductive layer. Z-directed component 150 is shown having on its top surface 150t, a locating feature 152 and a conductive top trace 154t extending between a conductive channel 156 and the edge of body 150d on its top surface 150t. A conductive bottom trace (not shown) is provided on the bottom surface. Conductive channel 156 extends through a portion of the body 150d as previously described. Located on the side surface 150s of body 150d is a least one semi-circular channel or grove. As shown, a pair of axially spaced apart circumferential channels 158a, 158b is provided having O-rings 160a, 160b, respectively disposed within channels 158a, 158b. A portion of the O-rings 160a, 160b extend out beyond the side surface 150s of the body 150d. O-rings 160a, 160b would be positioned adjacent one or more of the internal layers of the PCB to make electrical contract to one or more traces provided at that point in the mounting hole for the Z-directed component. Depending on the design employed, an O-ring would not have to be provided adjacent every internal layer.

O-rings 160a, 160b may be conductive or non-conductive depending on the design of the circuit in which they are used. O-rings 160a, 160b preferably would be compressive helping to secure Z-directed component 150 within the mounting hole. The region 162 of body 150d intermediate O-rings 160a, 160b may be comprised of different material than the regions 164 and 166 of the body 150d outside of the O-rings. For example, if the material of region 162 is of a resistive material and O-rings 160a, 160b are conductive then internal circuit board traces in contact with the O-rings 160a, 160b see a resistive load.

Regions 164 and 166 may also be comprised of a material having different properties from each other and region 162. For example, region 164 may be resistive, region 162 capacitive and region 166 inductive. Each of these regions can be electrically connected to the adjoining layers of the PCB. Further, conductive channel 156 and traces 154t, 154b do not need to be provided. So for the illustrated construction, between the top layer of the PCB and the first internal layer from the top, a resistive element may be present in region 164, a capacitive element between the first internal layer and the second internal layer in region 162 and an inductive element between the second internal layer and the bottom layer of the PCB in region 166. Accordingly, for a signal transmitted from an internal trace contacting conductive O-ring 160a to a second internal trace contacting conductive O-ring 160b, the signal would see an inductive load. The material for regions 162, 164, 166 may have properties selected from a group comprising conductive, resistive, magnetic, dielectric, capacitive or semi-conductive and combinations thereof. The design may be extended to circuit boards having fewer or more internal layers than that described without departing from the spirit of the invention.

In addition, regions 162, 164, 166 may have electronic components 167, 169, 171 embedded therein and connected as described herein. Also, as illustrated for component 171, a component may be found within one or more regions within the body of a Z-directed component. Internal connections may be provided from embedded components to O-rings 160a, 160b. Alternatively, internal connections may be provided from the embedded components to plateable pads provided on the side surface 150s.

The various embodiments and features discussed for a Z-directed component are meant to be illustrative and not limiting. A Z-directed component may be made of a bulk material that performs a network function or may have other parts embedded into its body. A Z-directed component may be a multi-terminal device and, therefore, may be used to perform a variety of functions including, but not limited to: transmission lines, delay lines, T filters, decoupling capacitors, inductors, common mode chokes, resistors, differential pair pass throughs, differential ferrite beads, diodes, or ESD protection devices (varistors). Combinations of these functions may be provided within one component.

FIG. 7 illustrates various example configurations for a conductive channel in a Z-directed component. As shown, channel 90 has a region 92 intermediate the ends comprising a material having properties selected from a group comprising conductive, resistive, magnetic, dielectric, capacitive or semi-conductive properties and combinations thereof These materials form a variety of components. Additionally, a component may be inserted or embedded into region 92 with portions of the conductive channel extending from the terminals of the component. A capacitor 92a may be provided in region 92. Similarly, a diode 92b, a transistor 92c such as a MOSFET 92d, a zener diode 92e, an inductor 92f, a surge suppressor 92g, a resistor 92h, a diac 92i, a varactor 92j and combinations of these items are further examples of materials that may be provided in region 92 of conductive channel 90.

While region 92 is shown as being centered within the conductive channel 90, it is not limited to that location.

For a multi-terminal device such as transistor 92c, MOSFET 92d, an integrated circuit 92k, or a transformer 92l, one portion of the conductive channel may be between the top surface trace and a first terminal of the device and the other portion of the conductive channel between the bottom surface trace and a second terminal of the device. For additional device terminals, additional conductors may be provided in the body of the Z-directed component to allow electrical connection to the remaining terminals or additional conductive traces may be provided within the body of the Z-directed component between the additional terminals and channels on the side surface of the body of a Z-directed component allowing electrical connection to an external conductive trace. Various connection configurations to a multiple terminal device may be used in a Z-directed component.

Accordingly, those skilled in the art will appreciate that various types of Z-directed components may be utilized including, but not limited to, capacitors, delay lines, transistors, switches, and connectors. For example, FIGS. 8 and 9 illustrate a Z-directed component termed a signal pass-through that is used for passing a signal trace from the top surface of a PCB to the bottom surface.

Z-Directed Signal Pass-Through Component

Figure 8:
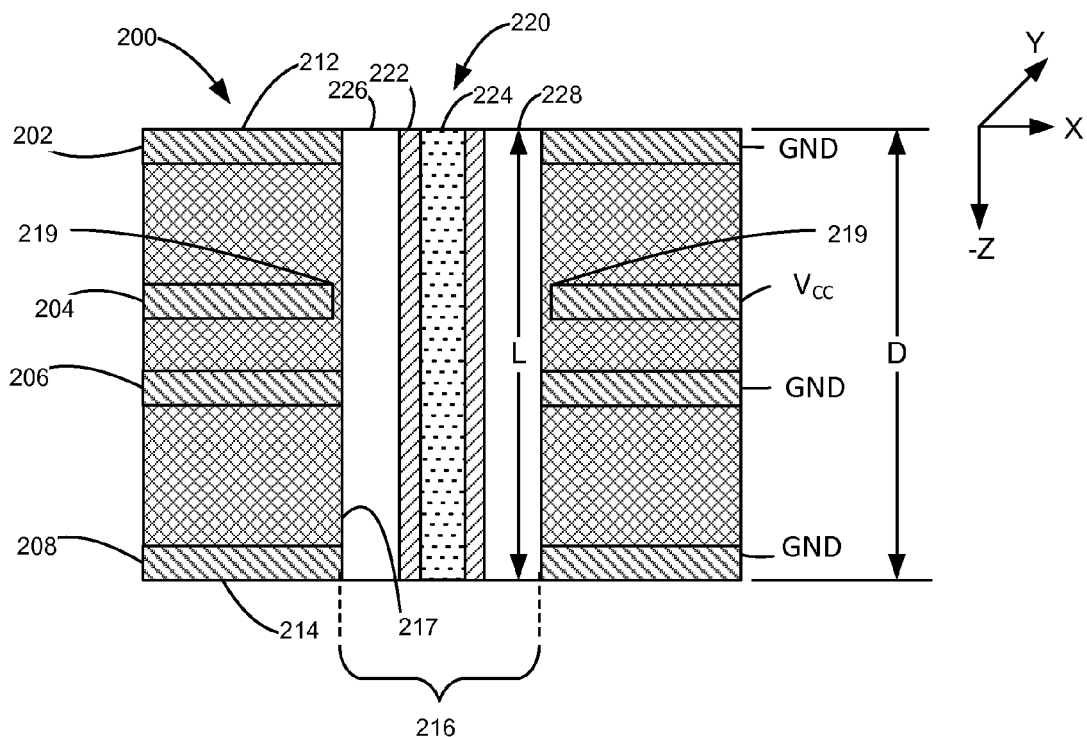
FIG. 8 is a schematic cross-sectional view of a Z-directed component flush mounted in a PCB showing conductive traces and connections to the Z-directed component according to one example embodiment.
Figure 9:
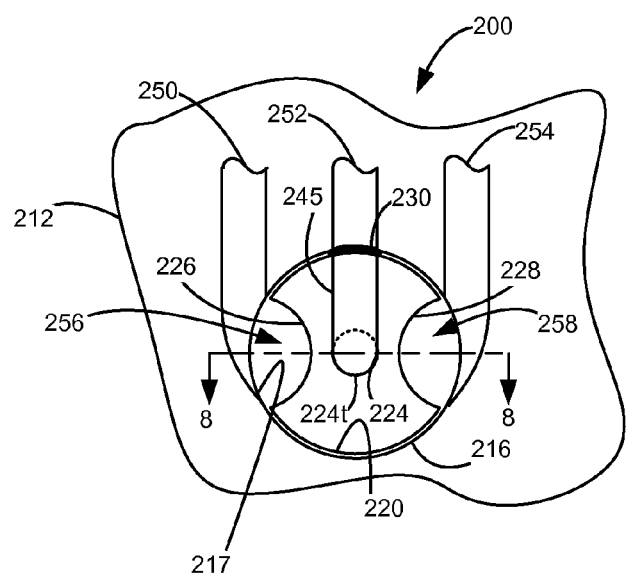
FIG. 9 is a top plan view of the Z-directed component and PCB shown in FIG. 8.

FIG. 8 shows a sectional view taken along line 8-8 in FIG. 9 of a PCB 200 having 4 conductive planes or layers comprising, from top to bottom, a ground (GND) plane or trace 202, a voltage supply plane $V_{CC}$ 204, a second ground GND plane 206 and a third ground GND plane or trace 208 separated by nonconductive material such as a phenolic plastic such as FR4 which is widely used as is known in the art. PCB 200 may be used for high frequency signals. The top and bottom ground planes or traces 202 and 208, respectively, on the top and bottom surfaces 212 and 214, respectively, of PCB 200 are connected to conductive traces leading up to Z-directed component 220. A mounting hole 216 having a depth D in a negative Z direction is provided in PCB 200 for the flush mounting of Z-directed component 220. Here depth D corresponds to the thickness of PCB 200; however, depth D may be less than the thickness of PCB 200 creating a blind hole therein. Mounting hole 216, as illustrated, is a through-hole that is round in cross-section to accommodate Z-directed component 220 but may have cross sections to accommodate the insertion of Z-directed components having other body configurations. In other words, mounting holes are sized so that Z-directed components are insertable therein. For example, a Z-directed component having a cylindrical shape may be inserted into a square mounting hole and vice versa. In the cases where Z-directed component does not make a tight fit, resist materials will have to be added to the areas of the component and PCB where copper plating is not desired.

Z-directed component 220 is illustrated as a three lead component that is flush mounted with respect to both the top surface 212 and bottom surface 214 of PCB 200. Z-directed component 220 is illustrated as having a generally cylindrical body 222 of a length L. A center conductive channel or lead 224, illustrated as being cylindrical, is shown extending the length of body 222. Two concave side wells or channels 226 and 228, which define the other two leads, are provided on the side surface of Z-directed component 220 extending the length of body 222. Side channels 226 and 228 are plated for making electrical connections to Z-directed component 220 from various layers of PCB 200. As shown, the ground plane traces on layers 202, 206, and 208 of PCB 100 are electrically connected to side channels 226 and 228. $V_{CC}$ plane 204 does not connect to Z-directed component 220 as shown by the gap 219 between $V_{CC}$ plane 204 and wall 217 of mounting hole 216.

FIG. 9 illustrates a top view of Z-directed component 220 in PCB 200. Three conductive traces 250, 252 and 254 lead up to the edge of wall 217 of mounting hole 216. As illustrated, trace 252 serves as a high-frequency signal trace to be passed from the top surface 212 to the bottom surface 214 of PCB 200 via Z-directed component 220. Conductive traces 250 and 254 serve as ground nets. Center lead or conductive channel 224 is electrically connected to trace 252 on the top surface 212 of PCB 200 by a top trace 245 and plating bridge 230. Top trace 245 on the top surface of Z-directed component 220 extends from the top end 224t of conductive channel 224 to the edge of Z-directed component 220. Although not shown, the bottom side of Z-directed component 220 and bottom surface 214 of PCB 200 is configured in a similar arrangement of traces as shown on top surface 212 of PCB 200 illustrated in FIG. 9. A bottom trace on the bottom surface of Z-directed component 220 extends from bottom of conductive channel 224 to the edge of Z-directed component 220. A plating bridge is used to make the electrical connection between the bottom trace and another high frequency signal trace provided on the bottom surface of PCB 200. The transmission line impedance of the Z-directed component can be adjusted to match the PCB trace impedance by controlling the conductor sizes and distances between each conductor which improves the high speed performance of the PCB.

During the plating process, wells 256 and 258 formed between wall 217 of mounting hole 216 and side channels 226 and 228 allow plating material or solder pass from the top surface 212 to the bottom surface 214 electrically interconnecting traces 250 and 254, respectively to side channels 226 and 228, respectively, of Z-directed component 220 and also to similarly situated traces provided on the bottom surface 214 of PCB 200 interconnecting ground planes or traces 202, 206 and 208. The plating is not shown for purposes of illustrating the structure. In this embodiment, $V_{CC}$ plane 204 does not connect to Z-directed component 220.

One of the challenges for high frequency signal speeds is the reflections and discontinuities due to signal trace transmission line impedance changes. Many PCB layouts try to keep high frequency signals on one layer because of these discontinuities caused by the routing of signal traces through the PCB. Standard vias through a PCB have to be spaced some distance apart which creates high impedance between the signal via and the return signal via or ground via. As illustrated in FIGS. 8 and 9, the Z-directed component and the return ground or signals have a very close and controlled proximity that allow essentially constant impedance from the top surface 212 to the bottom surface 214 of PCB 200.

Figure 10:
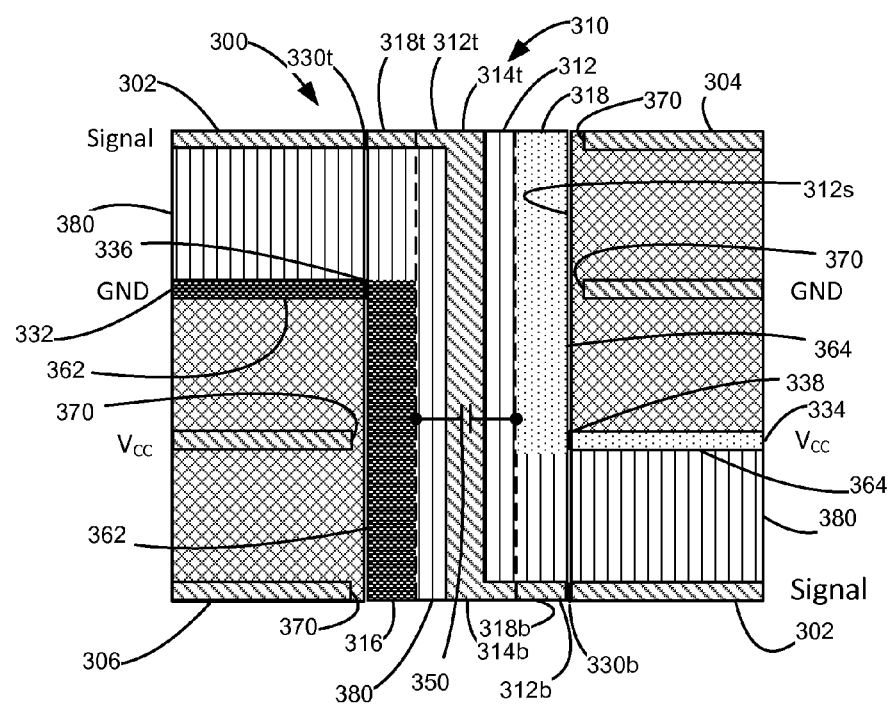
FIG. 10 is a schematic cross-sectional view of a Z-directed component flush mounted in a PCB showing ground loops for the Z-directed component with the Z-directed component further having a decoupling capacitor within its body according to one example embodiment.

A Z-directed signal pass through component may also comprise a decoupling capacitor that will allow the reference plane of a signal to switch from a ground plane, designated GND, to a voltage supply plane, designated $V_{CC}$, without having a high frequency discontinuity. FIG. 10 shows a cross-sectional view of a typical 4-layer PCB 300 with a signal trace 302 transferring between the top layer 304 and the bottom layer 306. Z-directed component 310, similar to that shown in FIG. 5D, having body 312 connects signal trace 302 through center conductive channel 314. Z-directed component 310 also comprises plated side channels 316 and 318 extending along the side surface 312s of the body 312. The top 314t and bottom 314b of conductive channel 314 are connected to conductive traces 318t and 318b on the top 312t and bottom 312b of body 312. These, in turn, are connected to signal trace 302 via top and bottom plating bridges 330t and 330b. Side channels 316 and 318 are plated to GND plane 332 and $V_{CC}$ plane 334, respectively. Connection points 336 and 338, respectively, illustrate this electrical connection. Schematically illustrated decoupling capacitor 350 is internal to body 312 and is connected between side channels 316 and 318. Decoupling capacitor 350 may be a separate capacitor integrated into the body 312 of Z-directed component 310 or it can be formed by fabricating a portion of the body 312 of Z-directed component 310 from the required materials with dielectric properties between conductive surfaces.

The path for signal trace 302 is illustrated with diagonal hatching and can be seen to run from top layer 304 to bottom layer 306. GND plane 332 and side channel 316 are electrically connected at 336 with the signal path return indicated by the dark stippling 362. $V_{CC}$ plane 334 and side channel 318 are electrically connected at 338 with the signal path return indicated by the light stippling 364. As is known in the art, where a signal plane or trace is not to be connected to the inserted part, those portions are spaced apart from the component as shown at 370. Where a signal plane or trace is to be connected to an inserted component, the signal plane or trace is provided at the wall or edge of the opening to allow the plating material or solder to bridge therebetween as illustrated at points 330t, 330b, 336, and 338.

The vertically hatched portion 380 shows the high speed loop area between the signal trace and return current path described by the signal trace 302 and the GND plane 332 or $V_{CC}$ plane 334. The signal trace 302 on the bottom surface 306 is referenced to power plane $V_{CC}$ 334 that is coupled to the GND plane 332 through decoupling capacitor 350. This coupling between the two planes will keep the high frequency impedance close to constant for the transition from one return plane to another plane of a different DC voltage.

Figure 11:
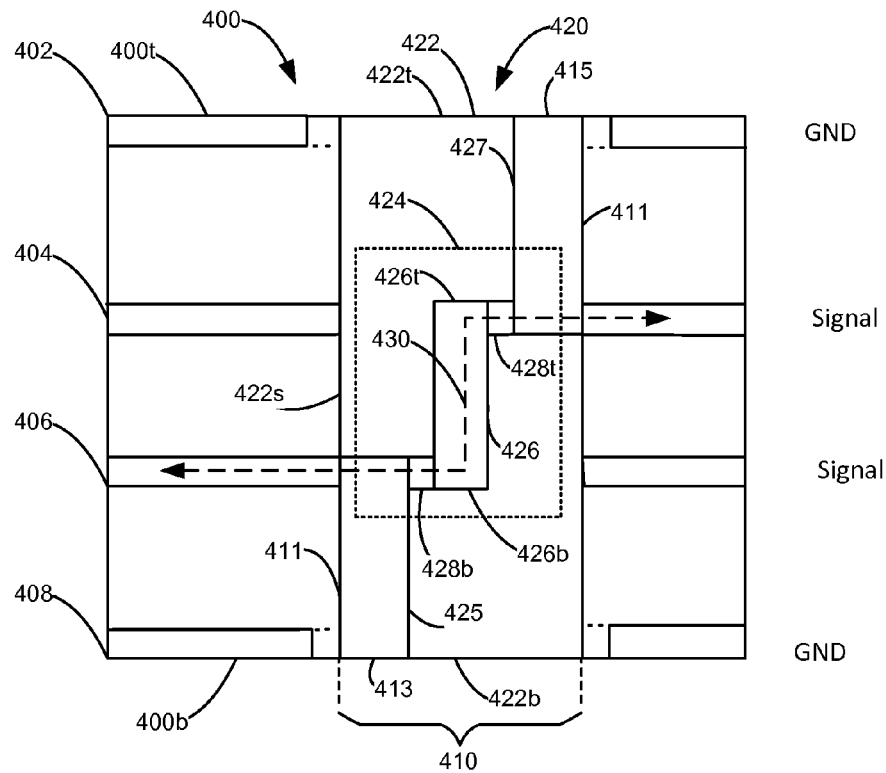
FIG. 11 is a schematic cross-sectional view of a Z-directed component flush mounted in a PCB showing a Z-directed component for transferring a signal trace from one internal layer of a PCB to another internal layer of that PCB according to one example embodiment.

Internally mounting Z-directed components in a PCB greatly facilitates the PCB technique of using outer ground planes for EMI reduction. With this technique, signals are routed on the inner layers as much as possible. FIG. 11 illustrates one embodiment of this technique. PCB 400 is comprised of, from top to bottom, top ground layer 402, internal signal layer 404, internal signal layer 406 and bottom ground layer 408. Ground layers 402 and 408 are on the top and bottom surfaces 400t and 400b of PCB 400. A mounting hole 410, shown as a through-hole, extends between the top and bottom surfaces 400t and 400b. Z-directed component 420 is shown flush mounted in PCB 400. Z-directed component 420 comprises body 422 having a center region 424 intermediate the top 422t and bottom 422b of body 422 and two side channels 425 and 427 on side surface 422s.

Side channels 425 and 427 and wall 411 of hole 410 form plating wells 413 and 415 respectively. Center region 424 is positioned within body 422 and extends a distance approximately equal to the distance separating the two internal signal layers 404 and 406. Side channel 425 extends from the bottom surface 422b of body 422 to internal signal level 406 while side channel 427 extends from top surface 422t of body 422 to internal signal level 404. Here, side channels 425 and 427 extend only along a portion of side surface 422s of body 422. Conductive channel 426 extends through center region 424 but does not extend to the top and bottom surfaces 422t, 422b of body 422. FIG. 5H illustrates a partial channel similar to side channel 427. Conductive channel 426 has conductive traces 428t and 428b extending from the top 426t and bottom 426b of conductive channel 426 to side channels 427 and 425, respectively. While illustrated as separate elements, conductive channel 426 and traces 428t, 428b may be one integrated conductor electrically interconnecting side channels 425, 427. As shown, conductive trace 428b is connected to internal signal layer 406 via plated side channel 425 and well 413 while trace 428t connects to internal signal level 404 via side channel 427 and well 415. Ground layers 402 and 408 are not connected to Z-directed component 420 and are spaced away from mounting hole 410 as previously described for FIGS. 8 and 10. As shown by double headed dashed arrow 430, a signal on signal layer 406 can be via'd to signal layer 404 (or vice versa) via Z-directed component 420 through a path extending from well 413, side channel 425, trace 428b, conductive channel 426, trace 428t, side channel 427, and well 415 to allow the signal to remain on the inner layers of PCB 400 with ground layers 402 and 408 providing shielding.

Z-Directed Decoupling Capacitors

Figure 12:
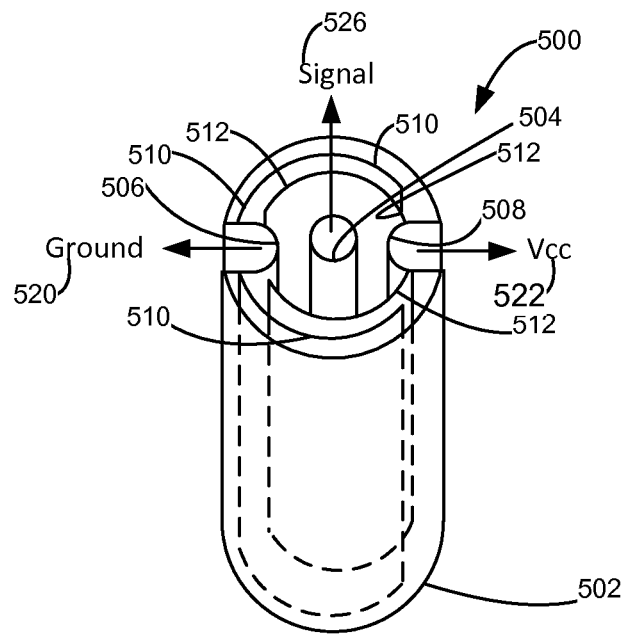
FIG. 12 is a perspective view of a Z-directed capacitor having semi-cylindrical sheets according to one example embodiment.
Figure 13:
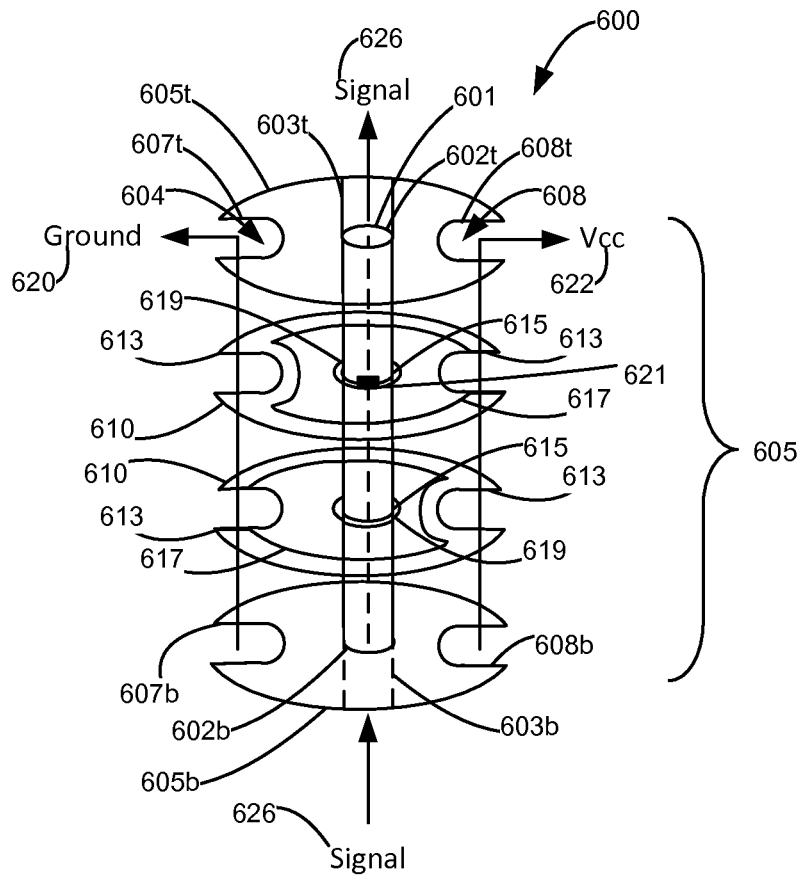
FIG. 13 is an exploded view of another embodiment of a Z-directed capacitor having stacked discs according to one example embodiment.

FIGS. 12 and 13 illustrate two additional example Z-directed components in the form of decoupling capacitors. In FIG. 12, a Z-directed capacitor 500 is shown with a body 502 having a conductive channel 504 and two side channels 506 and 508 extending along its length similar to those previously described. Conductive channel 504 is shown connected to a signal 526. Vertically oriented interleaved partial cylindrical sheets 510, 512 forming the plates of Z-directed capacitor 500 are connected to reference voltages such as voltage $V_{CC}$ and ground (or any other signals requiring capacitance) and are used with intervening layers of dielectric material (not shown). Partial cylindrical sheet 510 is connected to plated channel 506 which is connected to ground 520. Partial cylindrical sheet 512 is connected to plated channel 508 which is connected to supply voltage $V_{CC}$ 522. Sheets 510, 512 may be formed of copper, aluminum or other material with high conductivity. The material between the partial cylindrical sheets is a material with dielectric properties. Only one partial cylindrical sheet is shown connected to each of $V_{CC}$ 522 and ground 520; however, additional partial cylindrical sheets may be provided to achieve the desired capacitance/voltage rating.

Another embodiment of a Z-directed capacitor is shown in FIG. 13 using stacked support members connected to voltage $V_{CC}$ or ground. Z-directed capacitor 600 is comprised of center conductive channel 601 and a body 605 comprised of a top member 605t, a bottom member 605b, and a plurality of support members 610 (illustrated as disks) between the top and bottom members 605t, 605b.

Center conductive channel 601 extends through openings 615 in the assembled Z-directed capacitor 600 and openings 602t and 602b, all of which are sized to closely receive the center conductor. Center conductive channel 601 is electrically connectable to conductive traces 603t and 603b on the top and bottom portions 605t, 605b forming a signal path for signal 626. This connection is made by plating or soldering. Center conductive channel 601 is connected to signal 626 via conductive trace 603t. The bottom end of conductive channel 601 is connected in a similar fashion to a signal trace (not shown) via conductive trace 603b.

Opposed openings 607t and 608t are provided at the edge of top portion 605t. Bottom portion 605b is of similar construction as top portion 605t having opposed openings 607b and 608b provided at the edge. Between top and bottom portions 605t, 605b are a plurality of support members 610, which provide the capacitive feature. Support members 610 each have at least one opening 613 at their outer edge and an inner hole 615 allowing for passage of conductive channel 601 therethrough. As shown, two opposed openings 613 are provided in each support member 610. When assembled, the opposed openings 607t, 607b, 608t, 608b, and 613 align to form opposed side channels 604 and 608 extending along the side surface of Z-directed capacitor 600. Side channel 604 is shown connected to reference voltage such as ground 620 and side channel 606 to another reference voltage such as $V_{CC}$ 622. Support members 610 may be fabricated from a dielectric material and may be all of the same or varying thickness allowing for choice in designing the desired properties for Z-directed capacitor 600.

Annular plating 617 is provided on one of top and bottom surfaces of support member 610 or, if desired, on both surfaces. Annular plating is shown on the top surface of each support member but location of the annular plating can vary from support member to support member. Annular plating 617 generally conforms to the shape of the support member and extends from one of the edge openings 613 toward the other if an additional opening is provided. The annular plate 617 is of a diameter or dimension or overall size that is less than the diameter, dimension or overall size of support member 610 on which it is affixed. While the plate 617 is described as annular, other shapes may also be used provided that the plating does not contact the center conductive channel or extend to the edge of the support member on which it is plated or otherwise affixed. The annular plate does contact one of the edge openings 613 but is spaced apart from the other openings if more than one channel is present in the side surface of the body of Z-directed capacitor 600. Also, there is an opening 619 in annular plate 617 having a larger diameter than opening 615 in annular plate 617 through which conductive channel 601 passes. Opening 619 has a larger diameter than that of conductive channel 601 leaving annular plate 617 spaced apart from conductive channel 601.

As illustrated, the support members 610 are substantially identical except that when stacked, alternate members are rotated 180 degrees with respect to the member above or below it. This may be referred to as a 1-1 configuration. In this way, alternate members will be connected to one or the other of the two side channels. As shown in FIG. 13, the annular plating on the upper one of the two support members 610 is connected to side channel 608 and voltage $V_{CC}$ 622 while the annular plating on the lower one of the two support members 610 is connected to side channel 604 and ground 620. Other support member arrangements may also be used such as having two adjacent members connected to the same channel with the next support member being connected to the opposite channel which may be referred to as a 2-1 configuration. Other configurations may include 2-2, 3-1 and are a matter of design choice. The desired capacitance or voltage rating determines the number of support members that are inserted between top and bottom portions 605t, 605b. Although not shown, dielectric members comprised of dielectric material and similarly shaped to support members 610 may be interleaved with support members 610. Based on design choice, only a single channel may be used or more channels may be provided and/or the annular plating may be brought into contact with the center conductive channel and not in contact with the side channels. Again, the embodiments for Z-directed capacitors are for purposes of illustration and are not meant to be limiting.

With either design for a Z-directed capacitor, a second conductive channel may be provided in parallel with the first conductive channel that is disposed within the conductive plates to create a differential decoupling capacitor. Another embodiment of a Z-directed capacitor can be constructed from FIG. 12 or FIG. 13 by connecting the center conductive channel to one of the reference voltages at each support member that also has its annular plating connected to the same reference voltage. This may be accomplished simply by connecting the conductive channel to the annular plating as schematically illustrated by the jumper 621. In practice, the annular opening 619 in the annular plate 617 would be sized so that the annular plate and conductive channel 601 would be electrically connected. This component may be placed directly below a power pin or ball of an integrated circuit or other surface mounted component for optimum decoupling placement.

Again, the Z-directed signal pass-through components illustrated in FIGS. 8-11 and the Z-directed decoupling capacitors illustrated in FIGS. 12 and 13 provide merely a few example applications of a Z-directed component. Those skilled in the art will appreciate that various other types of Z-directed components may be utilized including, but not limited to, transmission lines, delay lines, T filters, decoupling capacitors, inductors, common mode chokes, resistors, differential pair pass throughs, differential ferrite beads, diodes, or ESD protection devices (varistors).

Process for Manufacturing a Z-Directed Component using a Sacrificial Constraining Material A process for manufacturing the Z-directed components on a commercial scale is provided. The process employs a sacrificial constraining material used as a structure to define and support the outer boundary and thickness of each layer being formed to construct the Z-directed component. The constraining layer allows the component to be constructed in an unfired state (e.g., a "green" state where the component body is formed from ceramic) and then be fired to solidify its form.

Figure 14A:
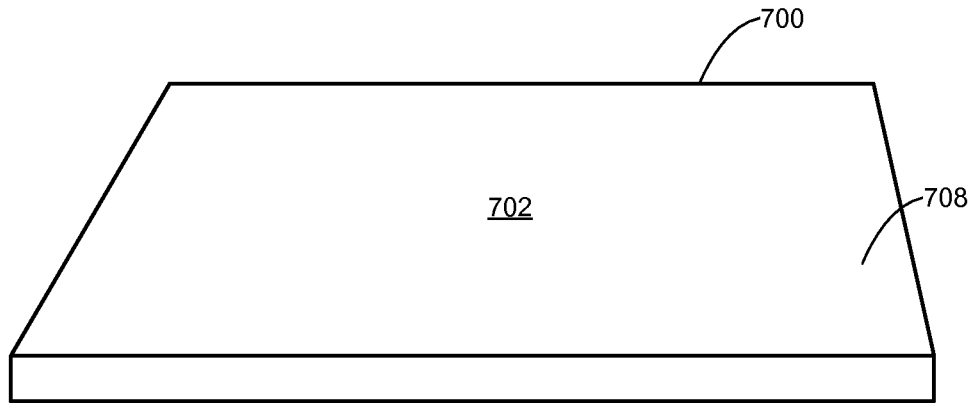
FIG. 14A is a perspective view of a sheet of substrate material used to form a Z-directed component according to one example embodiment.
Figure 14B:
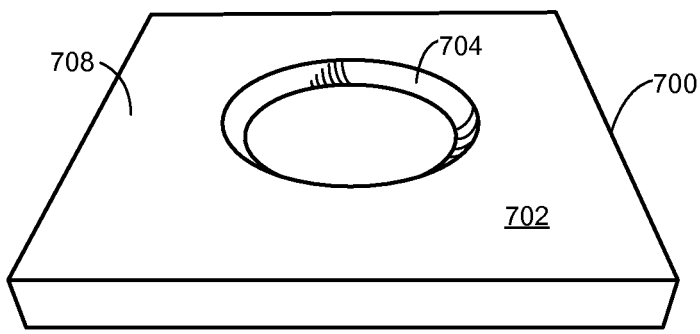
FIG. 14B is a perspective view of a sheet of substrate material according to another example embodiment having a rounded depression therein.
Figure 14C:
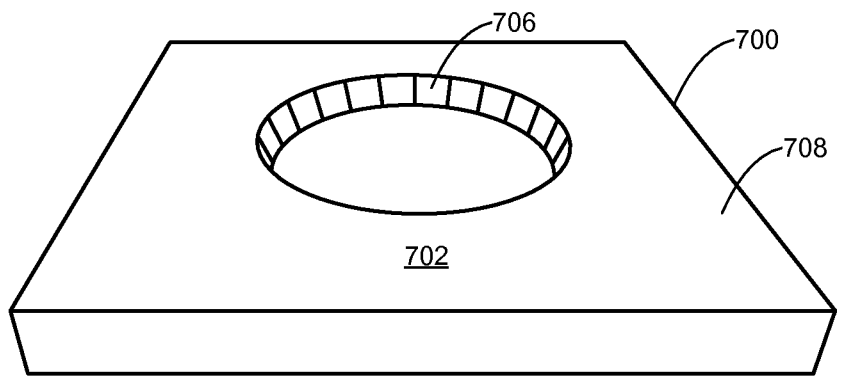
FIG. 14C is a perspective view of a sheet of substrate material according to another example embodiment having a chamfered depression therein.
Figure 15A:
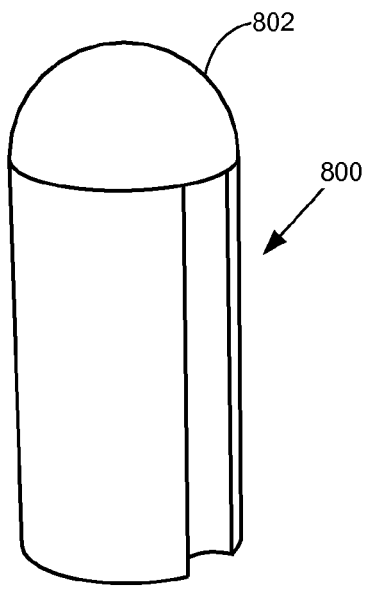
FIG. 15A is a perspective view of a Z-directed component having a dome formed on an end thereof according to one example embodiment.
Figure 15B:
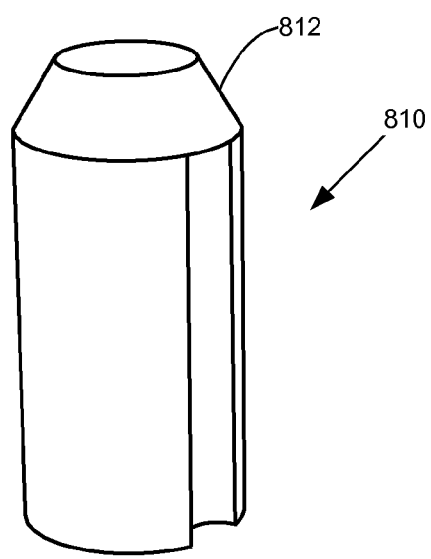
FIG. 15B is a perspective view of a Z-directed component having a chamfered end according to one example embodiment.

FIG. 14A shows a sheet 700 of substrate material that is used as a base to assemble the Z-directed component on top of The substrate material is compatible with the firing of the Z-directed component such that the firing temperature will not degrade the ability of sheet 700 to support the Z-directed component. The substrate material may be, for example, ceramic, glass or a silicon wafer. In the embodiment shown in FIG. 14A, sheet 700 includes a flat top surface 702. Alternatively, top surface 702 may include a tapered depression or dimple such as a rounded dimple 704 (shown in FIG. 14B) or a chamfered dimple 706 (shown in FIG. 14C). For simplicity, FIGS. 14B and 14C show a single dimple 704, 706, respectively; however, it will be appreciated that top surface 702 may include an array of depressions or dimples in order to permit the construction of many components at one time to maximize manufacturing efficiency. The depressed or dimpled top surface 702 allows a Z-directed component to be constructed that includes a chamfered, domed or other form of tapered lead-in on at least one of the top and bottom end of the Z-directed component. Such a lead-in may be desired in order to ease insertion of the Z-directed component into the mounting hole in the PCB. For example, FIG. 15A shows a Z-directed component 800 having a dome 802 formed on an end thereof FIG. 15B shows a Z-directed component 810 having a chamfered end 812. The dome 802 or chamfer 812 may be part of the component or attached thereto. In one embodiment, the dome 802 or chamfer 812 is a separate part that is partially inserted into the mounting hole in the PCB. In this embodiment, the Z-directed component is then inserted behind the dome 802 or chamfer 812 to push it through the mounting hole causing the dome 802 or chamfer 812 to expand the mounting hole and prevent the component from cutting or tearing the PCB. Where the dome 802 or chamfer 812 is attached to the Z-directed component, it may be configured to remain attached to the Z-directed component following insertion into the mounting hole in the PCB or it may be used to facilitate insertion and then removed.

With reference back to FIGS. 14A-14C, top surface 702, including any dimples or depressions therein, is coated with a release layer 708 that prevents the Z-directed component from adhering to the substrate material thereby allowing the component to be separated from sheet 700 without damaging or deforming the component. Release layer 708 may be applied to top surface 702 of sheet 700 by any suitable method capable of applying a thin layer of substantially equal thickness to the substrate material. For example, release layer 708 may be sprayed, squeegeed, spun, or laminated onto sheet 700. Release layer 708 is formed from a polymer or other material that does not react with any of the chemicals or radiations used during the construction of the Z-directed component so that the structure of release layer 708 does not change during the manufacturing process. In one embodiment, release layer 708 includes a polyimide (or a polyimide with glass fillers) due to its strength and resistance to etching chemicals. Suitable polyimides include, for example, UPILEX® available from Ube Industries, Ltd., Tokyo, Japan and KAPTON® available from E.I. du Pont de Nemours and Company (DuPont™), Wilmington, Del., USA. Release layer 708 is expected to dissipate during the firing process allowing the Z-directed component to release from sheet 700.

Figure 16:
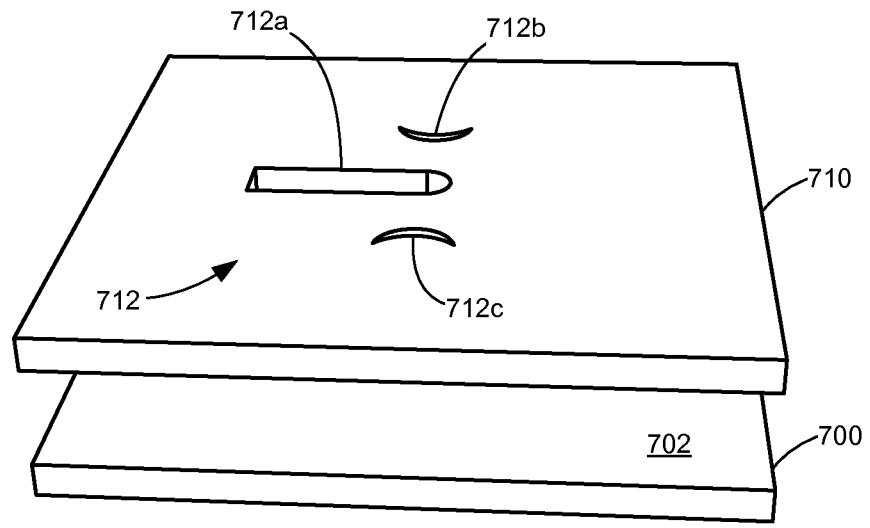
FIGS. 16-23 are sequential views showing the formation of a Z-directed component according to one example embodiment.

Each Z-directed component is then constructed one layer at a time on top surface 702 having release layer 708. If the bottom surface of the first layer built on sheet 700 (which may be the top or bottom surface of the component) requires surface conductors, the conductive material can be applied to top surface 702 having release layer 708 coated thereon. For example, FIG. 16 shows an example screen 710 that may be used to apply conductive material to top surface 702. Screen 710 includes openings 712 that allow conductive material to be applied to top surface 702 having release layer 708 coated thereon. In the example embodiment shown in FIG. 16, screen 710 includes a first opening 712a sized and shaped to permit the formation of a conductive trace from a center portion of the top or bottom surface of the Z-directed component to an edge of the component. In this embodiment, screen 710 also includes openings 712b and 712c sized and shaped to permit the formation of a conductive segment forming a portion of a conductive side channel in the component. Any suitable method may be used to apply the conductive material including, for example, etching, depositing (such as physical vapor deposition (PVD) or plating), spin coating, screen printing or jetting.

Figure 17:
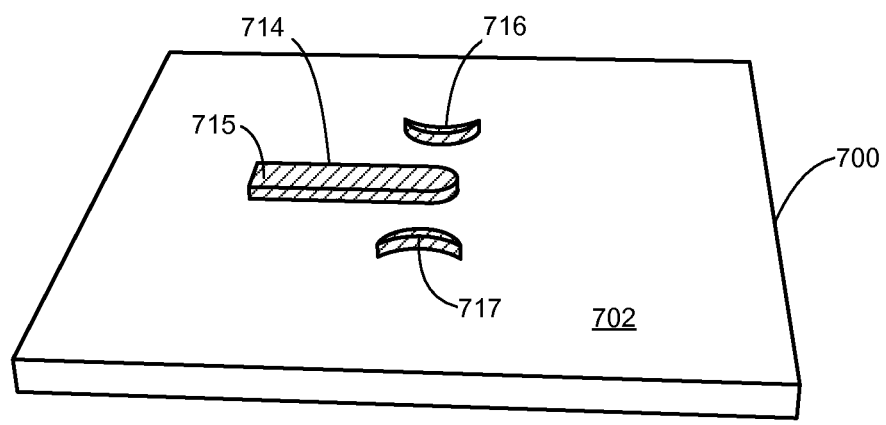

FIG. 17 shows sheet 700 having conductive material 714 applied on top surface 702. Conductive material 714 is illustrated with diagonal hatching. Specifically, conductive material 714 includes a conductive trace 715 positioned to run from a center portion of the top or bottom surface of the Z-directed component to an edge of the component for electrically connecting an interior conductive channel through the component to a trace on the PCB. Conductive material 714 also includes conductive segments 716 and 717 that form a portion of a conductive side channel in the component. Conductive material 714 may include binders to cause it to adhere to itself and to subsequent layers of the component. In this embodiment, the binders are allowed to cure between successive steps of the manufacturing process so that subsequent steps do not cause migration of material. Alternatively, where PVD or plating is used to apply conductive material 714, conductive material 714 may be pure metal or metal alloy.

Figure 18:
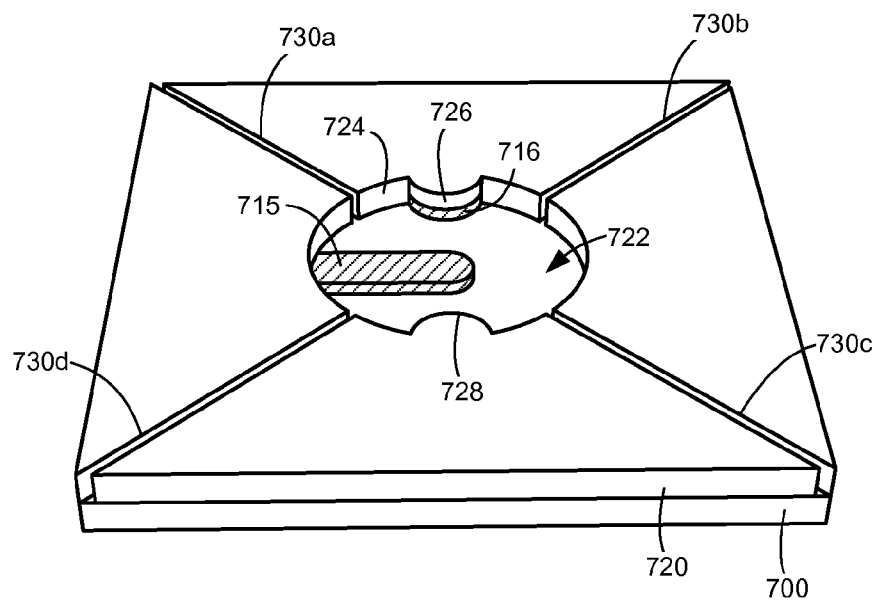

As shown in FIG. 18, a first layer of a sacrificial constraining material 720 is applied to top surface 702 having release layer 708 coated thereon. Sacrificial constraining material 720 forms a cavity 722 that defines the outer shape of the component. In the example embodiment illustrated, cavity 722 includes a generally cylindrical wall 724 defining a generally cylindrical shape of the first layer. Wall 724 includes a pair of protrusions 726, 728 that define a corresponding pair of side channels in the component. The thickness of this layer of sacrificial constraining material 720 is the same as the desired height of the first layer of the Z-directed component. In some embodiments, the layers of the component have a height that is between about 0.039 mil and about 62 mil (about 1 µm and about 1.57 mm), including all increments and values therebetween, depending on the application in which the Z-directed component will be used. It will be appreciated that the layers may be made thinner than about 1 µm as the technology advances. The heights of the layers making up a Z-directed component may be uniform or may vary within a single Z-directed component. In one embodiment, sacrificial constraining material 720 is the same material as release layer 708. Alternatively, sacrificial constraining material 720 may be any suitable material that will survive the chemicals and radiations used during the construction of the Z-directed component. Any suitable method may be used to apply sacrificial constraining material 720 including, for example, etching, depositing (such as physical vapor deposition (PVD) or plating), spin coating, screen printing or jetting.

The layer of sacrificial constraining material 720 may also include various channels 730 therethrough that extend from cavity 722 outward. Channels 730 will be filled with the material forming the body of the component (or another suitable material) in order to provide structural support for the component during the firing process while sacrificial constraining material 720 dissipates as discussed in greater detail below. FIG. 18 shows four channels 730a, 730b, 730c, 730d, although more or fewer channels 730 may be used as desired depending on the amount of structural strength needed. For example, in one embodiment, six channels 730 are provided in sacrificial constraining material 720 to maximize the structural strength. Channels 730 are preferably thin so that the radial support structures formed in channels 730 can be easily broken away to release the component after the component has been formed and fired. In the example embodiment illustrated, channels 730 are formed through wall portion 724 so as to connect with cavity 722. In this manner, the radial support structures formed by channels 730 are connected to the body of the Z-directed component. Alternatively, a thin layer of sacrificial constraining material 720 may be positioned between channels 730 and cavity 722 to prevent surface irregularities on the side surface of the Z-directed component when the component is separated from the radial support structures. Further, one or more of cavities 730 may be omitted in order to indicate the orientation of the part (i.e., by arranging cavities 730 asymmetrically), to reduce the amount of wasted component body material and to simplify the separation of the component(s) from the support structures.

Figure 19:
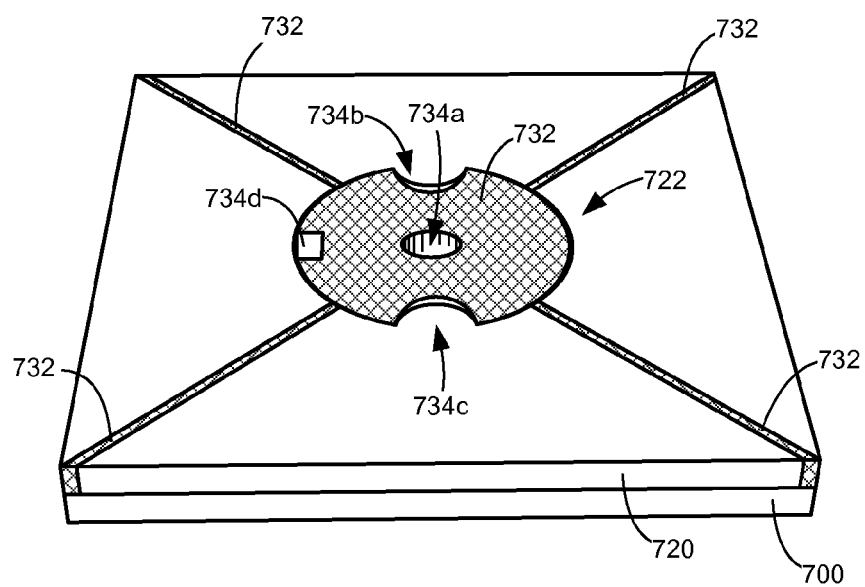

Cavity 722 and channels 730 are then filled with photoresist material, which may be any photo imageable epoxy or similar material. The photoresist material is then selectively exposed to a radiation source through a mask to create voids where conductive material is desired in the first layer of the component. Either positive or negative photoresist may be used as desired. FIG. 19 shows cavity 722 and channels 730 having photoresist material 732 (illustrated with x-hatching) therein after photoresist material 732 has been selectively etched to form voids 734 where conductive material is desired according to one example embodiment. Specifically, voids 734 include a center void 734a for forming a signal path through an interior portion of the component along the component's length. A pair of voids 734b, 734c are formed at opposite edges of cavity 722 next to protrusions 726, 728 for forming a pair of conductive side channels in the component. An additional void 734d is formed where conductive trace 715 meets the edge of cavity 722 for forming a conductive segment on the side surface of the component along its length to establish a connection to conductive trace 715.

Figure 20:
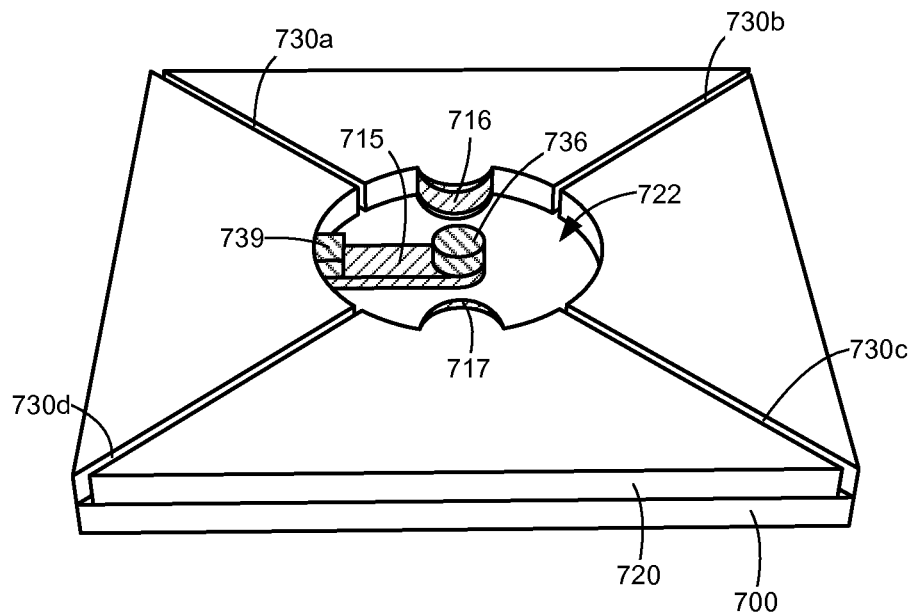

Voids 734 are then filled with conductive material 714. Voids 734 may be filled, for example, by squeegeeing, depositing, spin coating, screen printing or jetting as discussed above. After the conductive material binders have cured, the remaining photoresist material 732 is removed as shown in FIG. 20. As discussed above, sacrificial constraining material 720 is selected to survive the etching process. In the example embodiment illustrated, a center conductive channel 736 has been formed from void 734a that extends along the height of the layer of the component and electrically connects to trace 715. Additional conductive material 714 has been added to conductive segments 716 and 717 through voids 734b, 734c, respectively. An additional conductive segment 739 has been formed from void 734d that extends along the height of the layer and electrically connects to trace 715 at the edge of cavity 722. In some instances, manufacturing variations in the thickness of the PCB and the length of the Z-directed component may prevent the Z-directed component from being perfectly flush with both the top and bottom surfaces of the PCB. Conductive segment 739 forms a bridge between trace 715 and a corresponding trace on the PCB when the top or bottom surface of the Z-directed component extends past the corresponding top or bottom surface of the PCB. As a result, conductive segment 739 permits trace 715 on the Z-directed component to connect to the trace on the PCB even if the top or bottom surface of Z-directed component is not flush with the corresponding top or bottom surface of the PCB.

Figure 21:
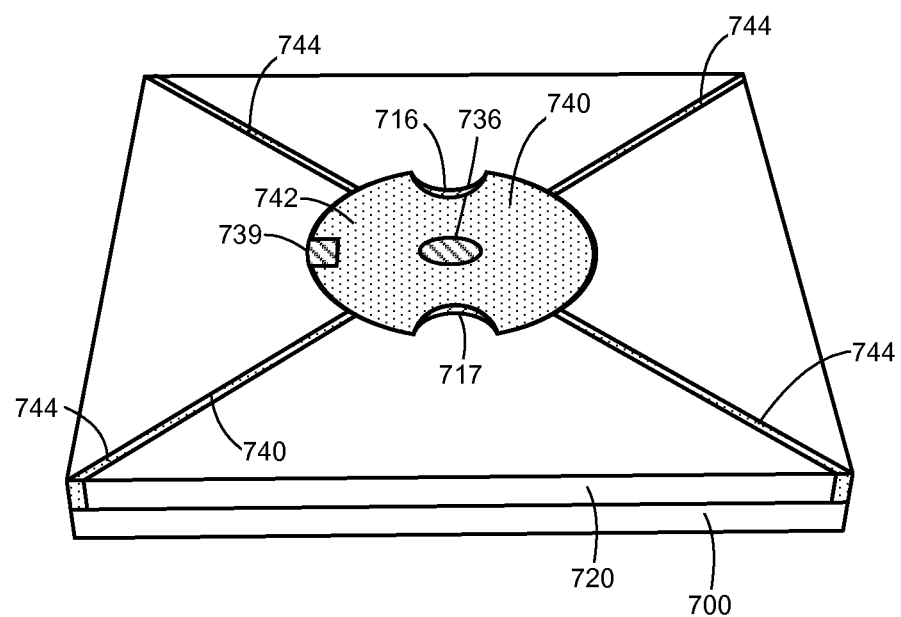

The remainder of cavity 722 is then filled with the material 740 forming the body 742 of the component as shown in FIG. 21. Body material 740 is illustrated with a dotted fill. At this stage, a first layer of the Z-directed component is formed. Body material 740 may include a single dielectric material that has a relative permittivity from about 3, e.g., polymers, to over 10,000, e.g., barium titanate ($BaTiO_3$). For example, a material with a relatively high dielectric value may be used in a Z-directed decoupling capacitor and a material with a relatively low dielectric value may be used in a Z-directed signal pass-through component. If a Z-directed component is desired to have an inductive function or a delay line then a ferrite material may be selected that has a low or high relative permeability with a range of about 1 to about 50,000. If a Z-directed component is desired to have some degree of conductivity then a conductive material may be mixed with a dielectric material to create a desired resistance.

Channels 730 are also filled with body material 740 to form radial supports 744. Body material 740 may include a binder material as necessary. Cavity 722 and channels 730 are filled so that body material 740 is flush with the top surface of sacrificial constraining material 720. As discussed above, this may be done, for example, by squeegeeing, depositing, spin coating, screen printing or jetting. Further, as discussed above, many different materials are contemplated for the body of the component, such as an insulator material, which may be a dielectric material. Conductive channel 736, conductive segments 716, 717 and 739 are shown exposed through the top surface of the layer of body 742. It will be appreciated that instead of first selectively applying conductive material 714 in cavity 722 and then applying body material 740, this sequence may be reversed as desired to instead selectively apply body material 740 prior to applying conductive material 714.

Figure 22:
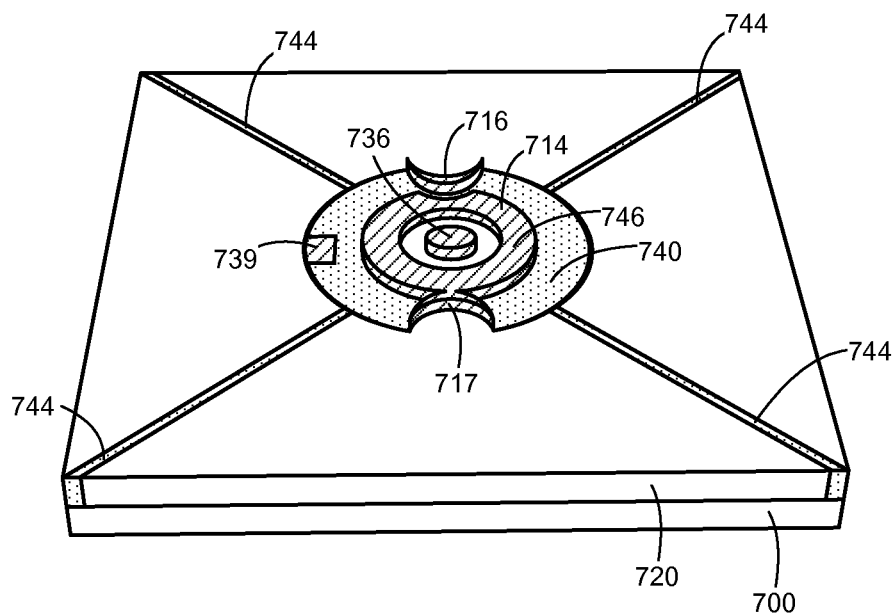

Once the binder material in body material 740 cures, additional layers may be formed on top of the first layer according to the same sequence. That is, additional layers of sacrificial constraining material 720 are applied one at a time each forming a cavity that defines the shape of the next layer. Conductive material 714, body material 740 and/or any other desired material(s) are selectively applied as desired to form the next component layer. This process is repeated until the entire component is formed. For example, FIG. 22 shows additional conductive material 714 applied on top of center conductive channel 736 and conductive segments 716, 717 of the conductive side channels. Conductive segment 739 does not need to be extended further as this element is provided to ensure that a connection can be made between conductive trace 715 and a corresponding trace on the top or bottom surface of the PCB. Further, additional conductive material 714 has been applied to form a conductive plate 746 on a top surface of the first layer in order to form a Z-directed capacitor having horizontal plates as discussed above with respect to FIG. 13. Conductive plate 746 is connected to conductive segment 717 but not conductive segment 716. As each layer of the capacitor is built, this sequence is reversed such that the connection to each conductive plate alternates between conductive segment 716 and conductive segment 717. The conductive plates may alternate in any pattern desired such as 1-1, 2-1, 3-1, 3-2, etc.

Figure 23:
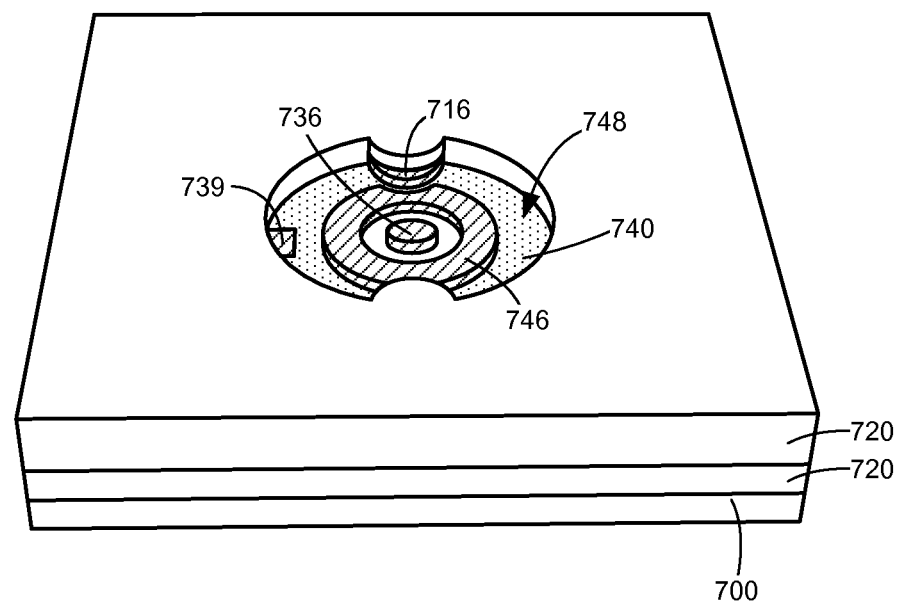

As shown in FIG. 23, additional sacrificial constraining material 720 may then be applied on top of the first layer of sacrificial constraining material 720 to define a cavity 748 for forming a second layer of the Z-directed component. The second layer of sacrificial constraining material 720 may or may not include channels 730 extending from cavity 748 depending on whether additional structural support is needed. If additional channels are included, they may be provided in the same number and locations as the first layer or in a different number and/or at different locations. Preferably, as few channels 730 as possible are used in order to minimize the occurrence of defects on the side surface of the component when the component is separated from radial supports 744. After each layer of the Z-directed component has been formed, conductive material 714 may applied to the top surface of the top layer as desired. A thin layer of body material 740 may also be applied to the top surface of the top layer so that body material 740 is flush with conductive material 714 to match the geometry of the bottom surface of the bottom layer.

The configuration of conductive material 714 shown in FIGS. 20-23 is meant to provide an example of the formation of a layer of the Z-directed component and it will be appreciated that any suitable amount, shape, size and placement of conductive material 714 may be used depending on the component desired. Specifically, while FIGS. 18-20 illustrate the formation of two conductive side channels, any number of conductive side channels may be formed as desired including no conductive side channels. Similarly, although one interior conductive channel 736 is shown, any number of conductive channels through an interior portion of the component may be formed as desired. Further, although generally cylindrical cavities 722, 748 are shown, many different component body shapes may be used as discussed above.

Figure 24:
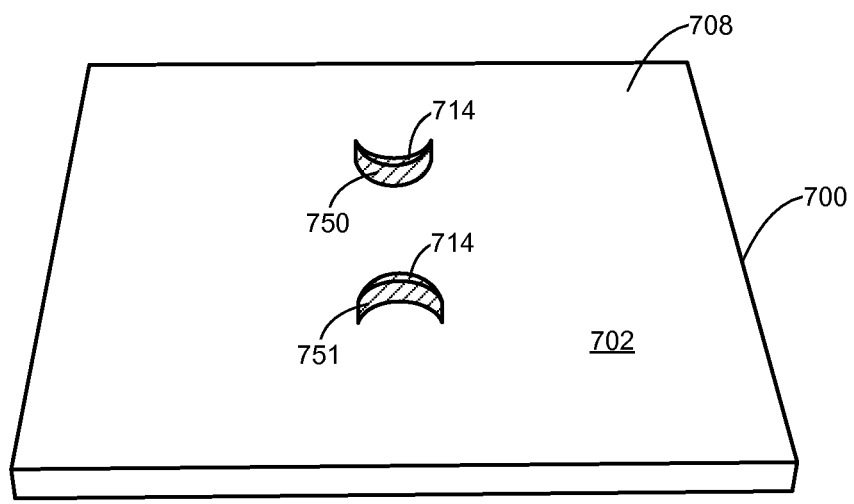
FIGS. 24-27 are sequential views showing the formation of a layer of a Z-directed component according to another example embodiment.
Figure 25:
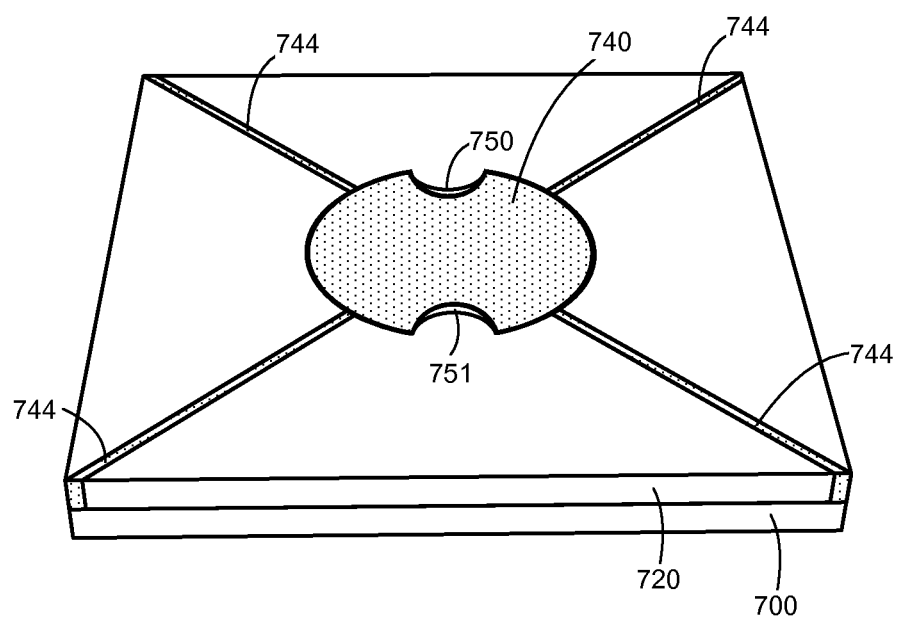
Figure 26:
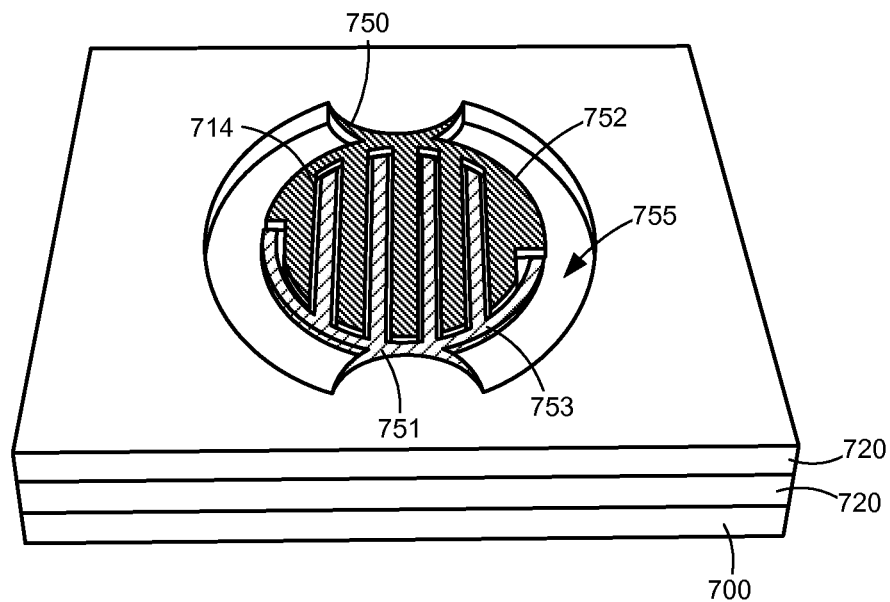

Although the formation of a Z-directed capacitor having horizontal plates is illustrated in FIGS. 22 and 23, a Z-directed capacitor may also be formed having vertical plates similar to the component shown in FIG. 12. To form a vertical plate capacitor, conductive material 714 may first be screened onto top surface 702 of sheet 700 having release layer 708 coated thereon to form a pair of conductive segments 750, 751 as shown in FIG. 24. Each conductive segment 750, 751 forms a portion of a respective conductive side channel in the component. A first layer of sacrificial constraining material 720 is then added and a cavity therein is filled with body material 740 as shown in FIG. 25. Conductive segments 750, 751 extend through the layer of body material 740. Another layer of sacrificial constraining material 720 is then added forming another cavity 755. Conductive material 714 is applied in cavity 755 in an alternating pattern as shown in FIG. 26 to form segments of two sets 752, 753 of vertical conductive plates. Set 752 is illustrated with heavy diagonal hatching while set 753 is illustrated with light diagonal hatching. In the example embodiment shown, sets 752, 753 of conductive segments forming vertical conductive plates are positioned in a 1-1 pattern; however, the plates may be arranged in any pattern desired. Set 752 of conductive plate segments is connected to conductive segment 750 forming a first conductive side channel in the component but spaced from conductive segment 751. Similarly, set 753 of conductive plate segments is connected to conductive segment 751 but not conductive segment 750.

Figure 27:
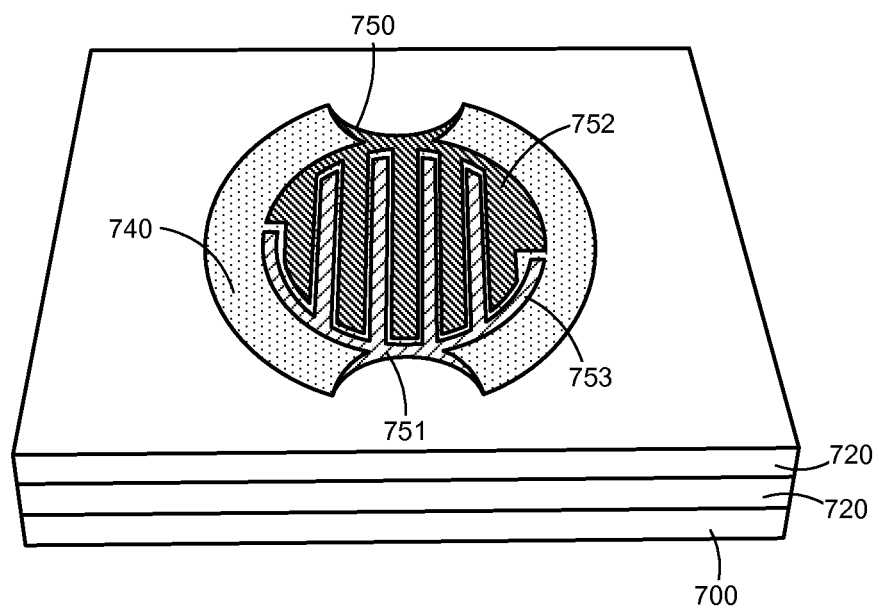

As shown in FIG. 27, cavity 755 may then be filled with body material 740 to complete the layer of the component. Body material 740 is flush with the tops of conductive segments 750, 751 and sets 752, 753 of the conductive segments forming the vertical plates. The rest of the component is then built layer by layer on top of the first formed layer as discussed above. Conductive segments 750, 751 extend along the length of the component and form conductive side channels in the component. Similarly, sets 752, 753 of conductive segments extend along the length of the component and form the vertical conductive plates of the capacitor. While the vertical plates in the example embodiment illustrated are relatively straight, as shown in FIG. 12, curved plates may also be used as desired. Further, although FIGS. 22 through 27 illustrate the formation of two different types of Z-directed capacitors, many different types of components are contemplated as discussed above including, but not limited to, transmission lines, delay lines, T filters, decoupling capacitors, inductors, common mode chokes, resistors, differential pair pass throughs, differential ferrite beads, diodes, and ESD protection devices (varistors).

Figure 28:
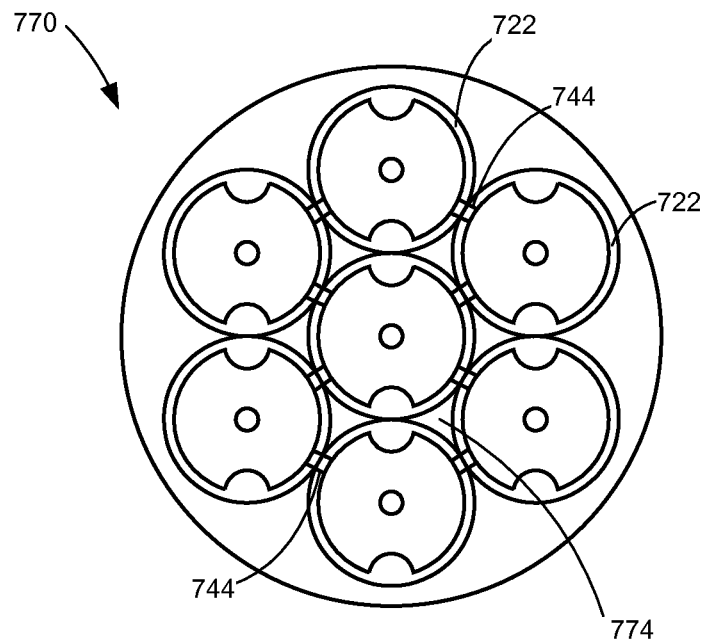
FIG. 28 is a schematic view of an example array for constructing multiple Z-directed components at one time.

FIG. 28 shows an example array 770 for constructing multiple Z-directed components 772 at one time. Array 770 positions the components 772 as close together as possible to maximize manufacturing efficiency. Radial supports 744 are shown linking pairs of components 772 together. In the example embodiment shown, concave triangles 774 formed from either sacrificial constraining material 720 or body material 740 are left between the components 772. These triangles 774 will be waste material when the manufacturing process is complete.

Figure 29:
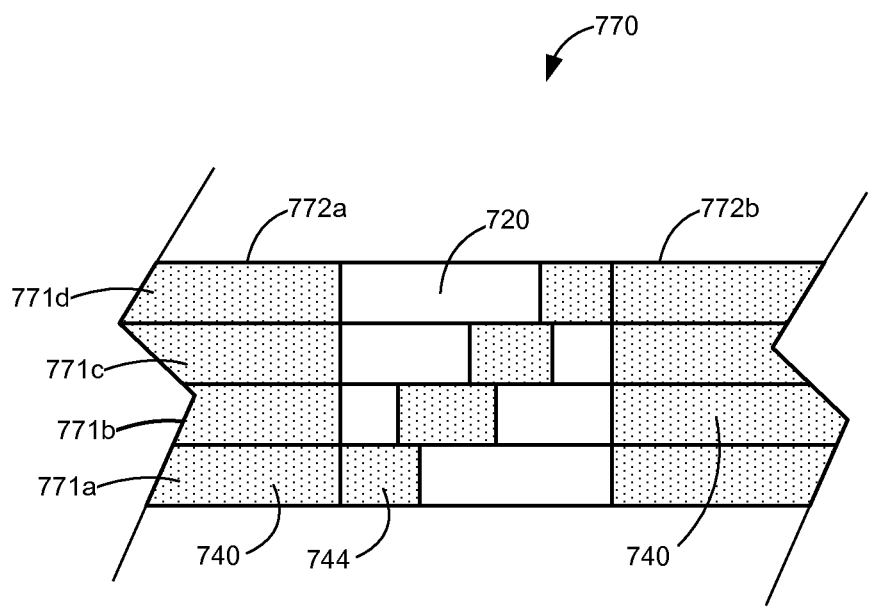
FIG. 29 is a side cutaway view showing radial supports that extend between adjacent components across multiple component layers according to one example embodiment.

Radial supports 744 may extend between components 772 along one layer as illustrated in FIGS. 21 and 22. Alternatively, some or all of radial supports 744 may extend across multiple layers. For example, FIG. 29 shows a side cutaway view of array 770 having layers 771*a*, 771*b*, 771*c*, 771*d*. Body material 740 is illustrated with a dotted fill and sacrificial constraining material 720 is illustrated without a fill. In this example, radial support 744 ascends in a stepped manner from near the bottom of one component 772*a* to near the top of an adjacent component 772*b* in array 770. Each segment of radial support 744 overlaps with the segment on the previous layer. An array 770 that incorporates both radial supports 744 that extend across a single layer and radial supports 744 that extend across multiple layers may be used to provide increased mechanical stability.

After the Z-directed component has been formed, a firing process is applied to solidify the part. The firing process also shrinks the part to its final dimensions. Accordingly, the component is formed larger than the final desired size to account for this shrinkage. As the component is fired, sacrificial constraining material 720 dissipates leaving radial supports 744 to hold the component in place. Alternatively, sacrificial constraining material 720 may be dissolved using a solvent or a plasma treatment before or after firing. Where the firing process is performed after dissolving sacrificial constraining material 720, the component may be prebaked prior to performing the solvent or plasma treatment in order to stabilize the component during the treatment and firing. The components can then be easily removed from radial supports 744 using a punching method to break the components away from radial supports 744. For example, array 770 of components can be positioned above and then punched into an array of cavities in a packaging plate that can assist with singling the components. Each cavity can help align the component as it is punched out of radial supports 744. The punched components can then be packaged using an automated device that pushes the part out of the packaging plate into a tape and reel system or a similar packaging system. To facilitate singulation, radial supports 744 connecting adjacent components may be attached part way up the side walls of the components (spaced from the top or bottom surface of the components) to permit more of each component to be constrained in its corresponding cavity during separation from radial supports 744.

Using a sacrificial constraining material that dissipates during firing to support the component as it is built eliminates the need to eject the component from a fixed constraining structure prior to firing which could result in smearing, tearing or otherwise damaging the structure of the component. The constraining material in combination with radial supports 744 prevents the components from moving during the firing process which could deform the parts or cause them to touch and stick together. Further, the process described herein is compatible with thick or thin film processes.

The Z-directed components can be tested for yield and performance while they are still connected to radial supports 744 or after they are separated. Conductive material 714 exposed on an outer surface of the components may be overplated using electrolysis techniques to provide a different surface conductive material from the conductive material 714 present in the interior of the component. Electrolysis techniques may also be used as each layer is formed to alter the surface characteristics of conductive material 714 if desired.

Further, exterior portions of conductive material 714 may be applied after the component has been formed instead of as each layer is formed. For example, conductive material 714 may be applied to the side channels in the component after the component is formed. Resist areas may be added to the Z-directed components to keep the conductive material from sticking to areas that are not intended to be conductive. Glue areas may be applied to the components to assist with retaining them in a PCB. Visible markings and/or locating features may also be added to the Z-directed components to assist with assembly into a PCB.

Once production of a Z-directed component is complete, it is ready to be inserted into the mounting hole of the PCB. As discussed above, the component may be mounted normal to the plane of the PCB from the top or bottom surfaces or both surfaces, mounted at an angle thereto or inserted into the edge of the PCB between the top and bottom surfaces of the PCB. In some embodiments, the Z-directed component is press fit into the mounting hole. This press fit may be in the form of an interference fit between the component and the mounting hole. After the Z-directed component is positioned in the mounting hole, a conductive plating bridge may be applied to connect one or more traces on the top and/or bottom surface of the component to a corresponding trace on the PCB. Further, where the Z-directed component includes side channels therein, additional conductive plating may be applied to these side channels to form the desired signal connections between the Z-directed component and the PCB.

Figure 30:
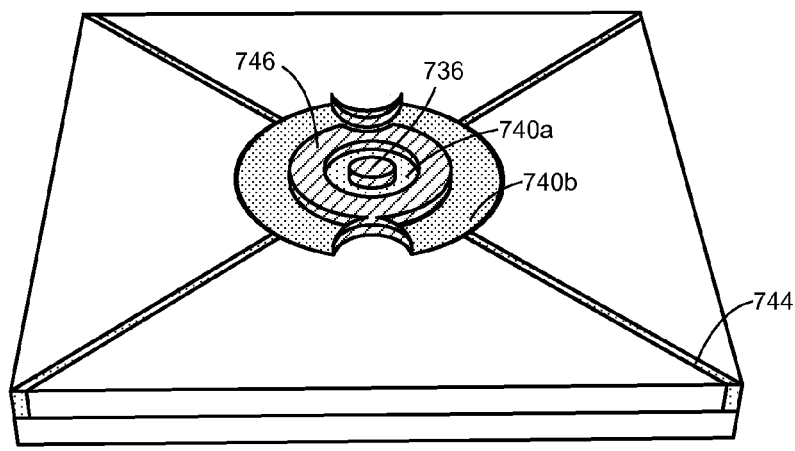
FIG. 30 is a perspective view showing the formation of a layer of a Z-directed component having multiple dielectric materials according to one example embodiment.

While FIGS. 18-23 illustrate the use of a single body material 740 to form the Z-directed component, it will be appreciated that multiple body materials may be used as desired such as, for example, multiple dielectric materials each having a different dielectric constant. For example, FIG. 30 shows a first layer of a Z-directed capacitor formed from a first body material 740a having a relatively low dielectric constant (e.g., between about 6 and about 100) surrounding conductive channel 736 and a second body material 740b having a relatively high dielectric constant (e.g., between about 2,000 and about 25,000) surrounding the first body material 740a. Body material 740a is illustrated with a light dotted fill and body material 740b is illustrated with a heavy dotted fill. Each body material 740a, 740b may be selectively applied using the process discussed above.

Figure 31:
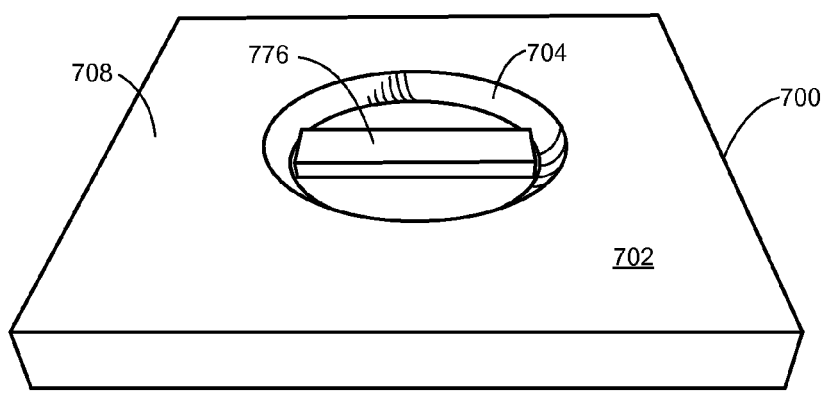
FIG. 31 is a perspective view showing a sheet of substrate material having a depression for forming an indentation in the top or bottom surface of the Z-directed component to facilitate removal of a rounded lead-in according to one example embodiment.

In some embodiments, the tapered end of the component formed using the depressions or dimples discussed above with respect to FIGS. 14B and 14C may be removable. In these embodiments, the tapered end may serve as a lead-in to ease insertion of the Z-directed component into the mounting hole in the PCB and then be removed after the component is mounted in the PCB. The top or bottom surface of the component may include a projection or indentation to facilitate removal of the tapered end portion of the component. For example, FIG. 31 illustrates an example sheet 700 of substrate material for forming an indentation in the top or bottom surface of the component to facilitate removal of a rounded lead-in. In the example embodiment illustrated, a portion of rounded dimple 704 formed in top surface 702 of sheet 700 includes a protrusion 776 that forms a corresponding indentation in the bottom surface of the bottom layer of the component (which again may be the top or bottom surface of the component in use in the PCB). Top surface 702 including rounded dimple 704 and protrusion 776 are coated with release layer 708 as discussed above. The indentation in the top or bottom surface of the component allows the lead-in to be twisted and separated from the component as discussed in greater detail below.

Figure 32:
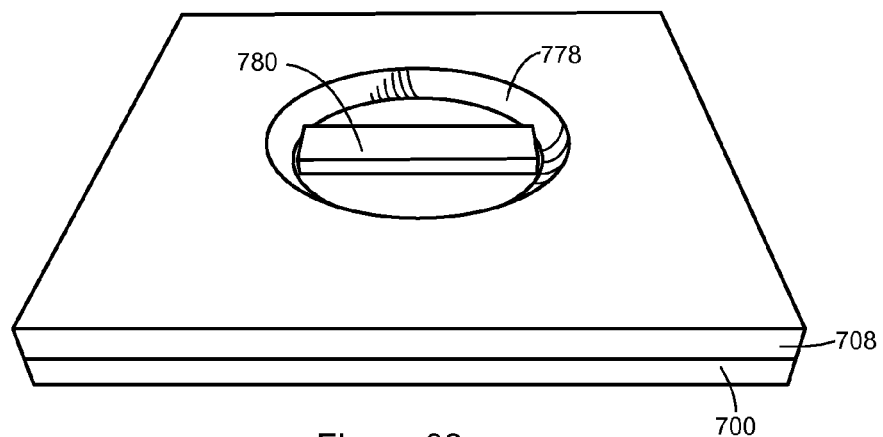
FIG. 32 is a perspective view showing a release layer applied to the substrate material and having a depression for forming an indentation in the top or bottom surface of the Z-directed component according to one example embodiment.
Figure 33:
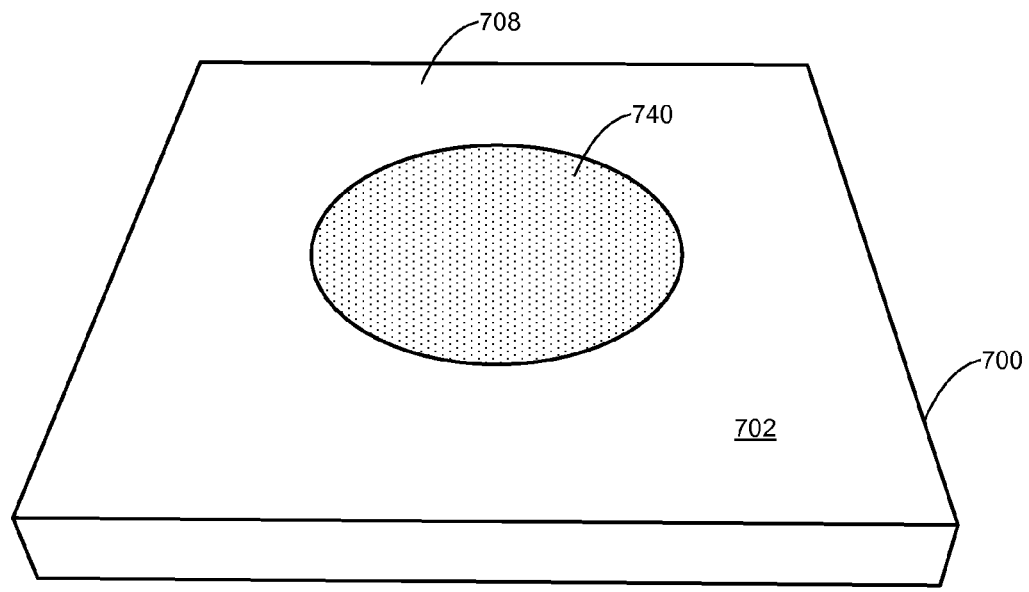
FIG. 33 is a perspective view showing body material applied to the depression shown in FIG. 31 according to one example embodiment.
Figure 34:
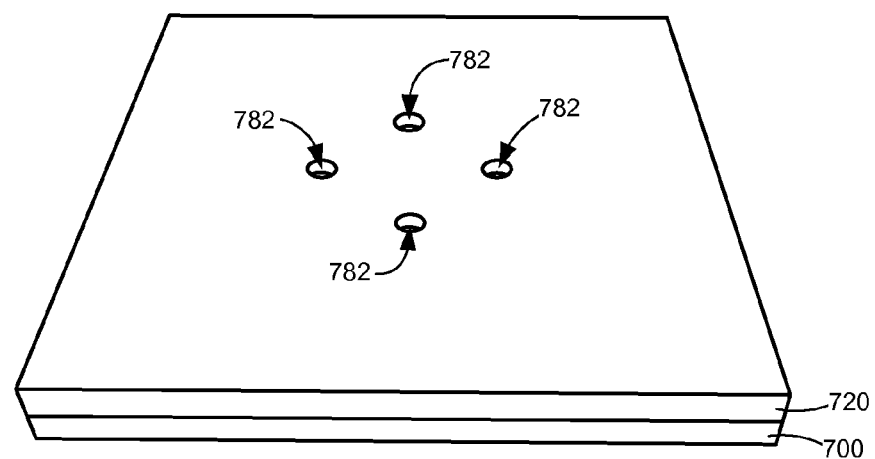
FIG. 34 is a perspective view showing a layer of sacrificial constraining material applied to the substrate material and having cavities therein for connecting the removable lead-in to the component according to one example embodiment.

In another embodiment, a tapered end portion may be formed on the component using sheet 700 shown in FIG. 14A having a flat top surface 702. With reference to FIG. 32, a thick coat of release layer 708 is applied to flat top surface 702 and a depression 778 (e.g., rounded or chamfered) having the desired profile is formed in release layer 708 using grayscale lithography. Specifically, depression 778 is formed using a diffused radiation exposure to selectively and partially etch release layer 708. For example, using a positive etching process, the intensity of the radiation exposure is directly proportional to the depth of the etch. Full exposure may be used to etch the deepest portion of depression 778. The rounded or chamfered portion of depression 778 is formed by decreasing the amount of radiation exposure. It will be appreciated that this process is reversed if a negative etching process is used. Further, a protrusion 780 may also be formed in depression 778 by selectively altering the radiation exposure.

Where a removable end portion is desired, the depression (either in the substrate material 700 or release layer 708) is filled with body material 740 as shown in
FIG. 33 to form the removable tapered end portion. With reference to FIG. 34, a layer of sacrificial constraining material 720 is then applied to top surface 702 having release layer 708 coated thereon. This layer of sacrificial constraining material 720 includes at least one (and preferably a few) cavities 782 that connect to the tapered end portion formed from body material 740. For example, FIG. 34 shows four small cavities 782. Cavities 782 are then filled with body material 740 to establish a connection between the body of the Z-directed component and the removable tapered end portion. Cavities 782 are sized so that the connection is sufficiently strong to hold the tapered end portion in place during insertion of the component into the mounting hole in the PCB but weak enough that the tapered end portion can be selectively fractured after insertion. The geometry of cavities 782 may be chosen to provide a desired between insertion strength and ease of removal. For example, cavities 782 illustrated in FIG. 34 have a circular cross-section. Alternatively, rectangular cavities may provide connectors that are strong along their length but possess low strength to shear forces along their width.

Figure 35:
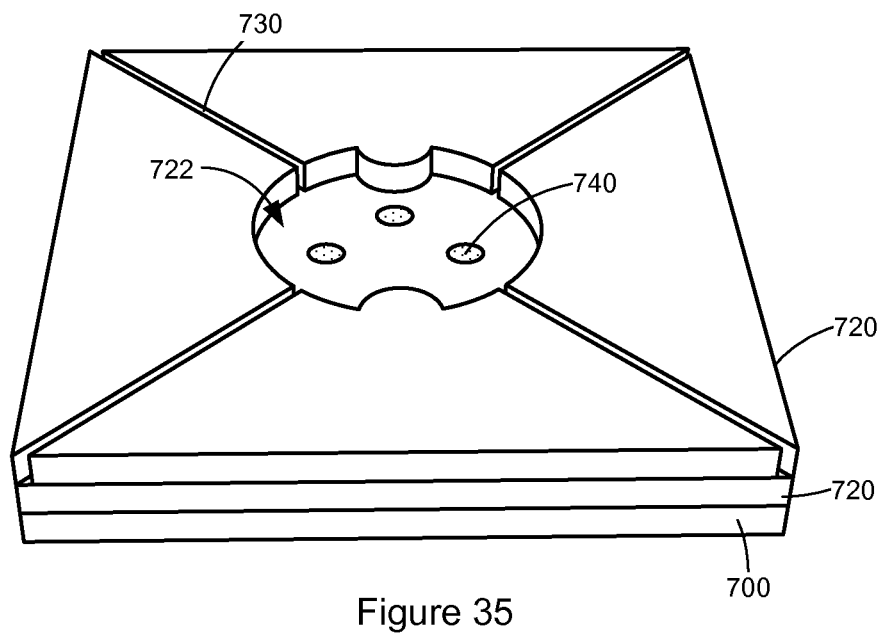
FIG. 35 is a perspective view showing an additional layer of sacrificial constraining material applied to form a layer of the Z-directed component according to one example embodiment.
Figure 36:
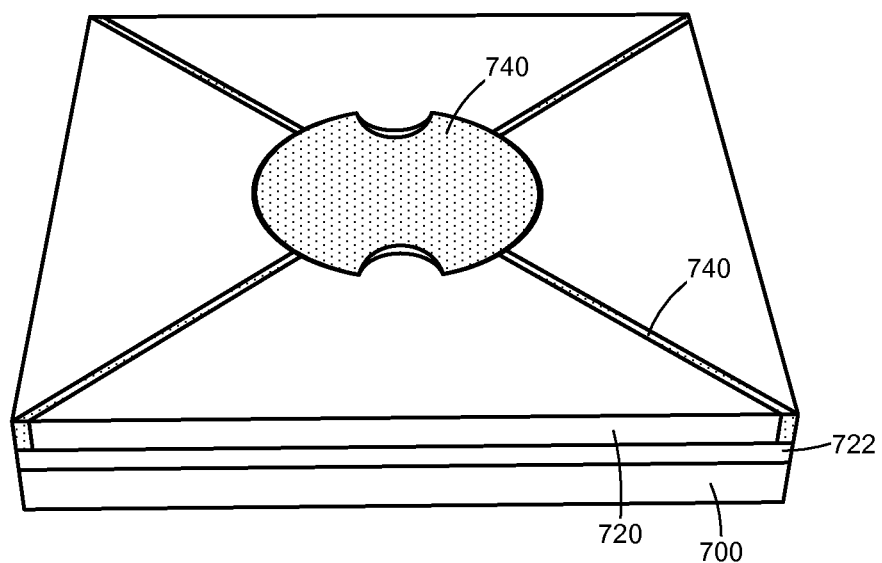
FIG. 36 is a perspective view showing body material applied to the sacrificial constraining material shown in FIG. 35.

After cavities 782 are filled, as shown in FIG. 35, a layer of sacrificial material 720 is added having cavity 722 sized to form the first layer of the Z-directed component as discussed above. This layer of sacrificial material 720 may also include cavities 730 extending radially from cavity 722 as discussed above. Cavity 722 is then selectively filled with conductive material 714, body material 740 and/or any other desired materials as discussed above. For example, FIG. 36 shows cavity 722 filled with body material 740. The connectors formed from body material 740 in cavities 782, which are positioned at the bottom of cavity 722 as shown in FIG. 35, establish a connection between the tapered end portion and the first layer of the component body. The Z-directed component is then formed layer by layer as discussed above using additional layers of sacrificial constraining material 720 to define the outer structure of the component.

Figure 37:
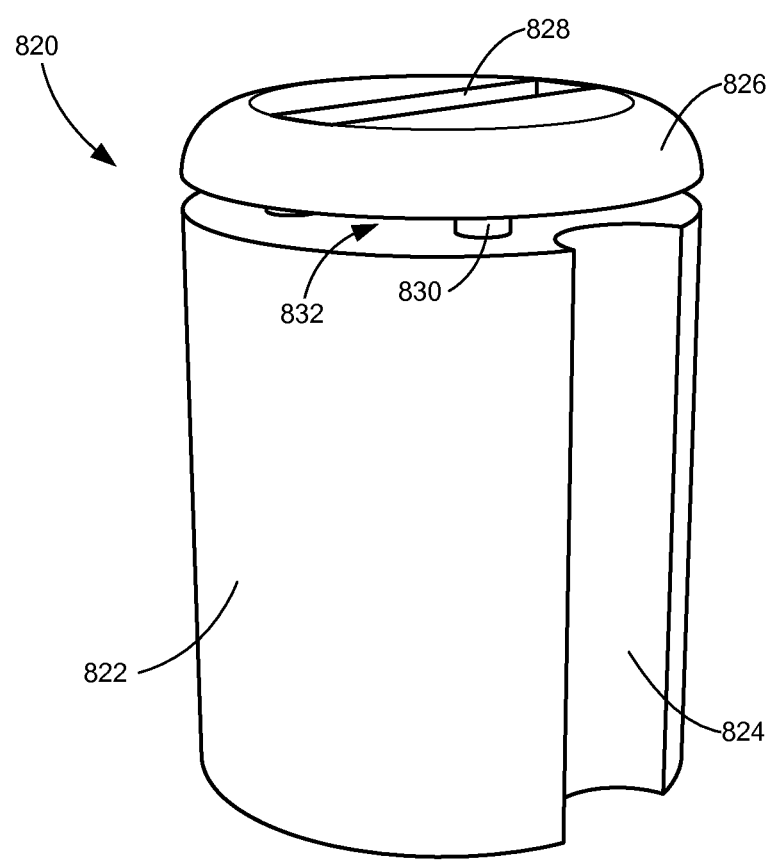
FIG. 37 is a perspective view of a Z-directed component having a removable rounded lead-in according to one example embodiment.

FIG. 37 shows the resulting Z-directed component 820. Component 820 includes a main body portion 822 having a pair of side channels 824 (one of which is not shown). Component 820 also includes a rounded end portion 826 formed from depression 704. End portion 826 includes a narrow indentation 828 formed from protrusion 776. End portion 826 is connected to body portion 822 by four connectors 830 formed from cavities 782. In this manner, main body portion 822, rounded end portion 826 and connectors 830 are formed integrally with each other. The remaining area between end portion 826 and body portion 822 is open. The gap 832 between end portion 826 and body portion 822 is preferably very small but is shown enlarged in FIG. 37 for illustration purposes. After component 820 is inserted into the mounting hole in the PCB, end portion 826 may be removed using a tool shaped to engage indentation 828 and configured to twist end portion 826 to break connectors 830 and separate end portion 826 from body portion 822.

The foregoing description of several embodiments has been presented for purposes of illustration. It is not intended to be exhaustive or to limit the application to the precise forms disclosed, and obviously many modifications and variations are possible in light of the above teaching. It is understood that the invention may be practiced in ways other than as specifically set forth herein without departing from the scope of the invention. It is intended that the scope of the application be defined by the claims appended hereto.

What is claimed is:
1. A method for manufacturing a Z-directed component for insertion into a mounting hole in a printed circuit board, comprising:
  forming the Z-directed component in a cavity formed by a constraining material that defines the outer shape of the Z-directed component;

dissipating the constraining material to release the Z-directed component from the constraining material; and
firing the Z-directed component.

2. The method of claim 1, wherein the constraining material is dissipated by heat when the Z-directed component is fired.

3. The method of claim 1, wherein the constraining material is dissipated by a solvent or plasma treatment.

4. The method of claim 1, wherein forming the Z-directed component includes:
    providing successive layers of the constraining material, each layer of the constraining material having a cavity formed therein defining the outer shape of a corresponding layer of the Z-directed component; and
    selectively filling each cavity with at least one material to form each layer of the Z-directed component.

5. A method for manufacturing a Z-directed component for insertion into a mounting hole in a printed circuit board, comprising:
    providing successive layers of a constraining material, each layer of the constraining material having a cavity formed therein defining the outer shape of a corresponding layer of the Z-directed component;
    selectively filling each cavity with at least one material to form each layer of the Z-directed component, wherein each cavity is selectively filled prior to providing the next successive layer of the constraining material;
    dissipating the constraining material to release the Z-directed component from the constraining material; and
    firing the Z-directed component.

6. The method of claim 5, wherein the constraining material is dissipated by heat when the Z-directed component is fired.

7. The method of claim 5, wherein the constraining material is dissipated by a solvent or plasma treatment.

8. The method of claim 5, wherein each successive layer of the constraining material is stacked on top of the previous layer of the constraining material.

9. The method of claim 8, wherein the layers of the constraining material are formed on top of a substrate that survives when the constraining material is dissipated.

10. The method of claim 9, wherein the substrate includes a depression therein that forms a tapered end of the Z-directed component.

11. The method of claim 9, wherein a top surface of the substrate is coated with a release layer and the release layer dissipates with the constraining material to release the Z-directed component from the substrate.

12. The method of claim 5, wherein at least a portion of the cavities formed in the constraining material are filled with a plurality of different materials.

13. The method of claim 12, wherein the plurality of different materials are selectively applied using photo etching techniques.

14. The method of claim 5, further comprising filling a channel extending outward from at least one of the cavities in the constraining material to form a support structure positioned to support the Z-directed component after the constraining material dissipates.

15. The method of claim 14, wherein the support structure connects adjacent Z-directed components in an array of Z-directed components.

16. The method of claim 15, wherein the support structure stair steps across at least two of the layers of the constraining material.

17. The method of claim 5, further comprising filling a channel extending outward from at least one of the cavities in the constraining material to form a support structure positioned to support the Z-directed component after the constraining material dissipates, wherein each successive layer of the constraining material is stacked on top of the previous layer of the constraining material, wherein at least a portion of the cavities formed in the constraining material are filled with a plurality of different materials, wherein the constraining material is dissipated by heat when the Z-directed component is fired.

18. A method for manufacturing a Z-directed component for insertion into a mounting hole in a printed circuit board, comprising:
    providing a first layer of a constraining material having a first cavity formed therein defining the outer shape of a first layer of the Z-directed component;
    selectively filling the first cavity with at least one material to form a first layer of the Z-directed component;
    combining the first layer of the Z-directed component with additional layers to form the Z-directed component;
    dissipating the constraining material to release the Z-directed component from the constraining material; and
    firing the Z-directed component.

19. The method of claim 18, wherein the constraining material is dissipated by heat when the Z-directed component is fired.

20. The method of claim 18, wherein the constraining material is dissipated by a solvent or plasma treatment.

21. The method of claim 18, wherein combining the first layer of the Z-directed component with additional layers to form the Z-directed component includes forming additional layers of the Z-directed component on top of the first layer of the Z-directed component.

* * * * *